(12) United States Patent
Hamre et al.

(10) Patent No.: US 8,054,907 B2
(45) Date of Patent: Nov. 8, 2011

(54) WAVEFORM ANALYZER

(76) Inventors: John David Hamre, Plymouth, MN (US); Peng Li, Palo Alto, CA (US); Jan Brian Wilstrup, Mounds View, MN (US); Steven John McCoy, Eden Prairie, MN (US)

( * ) Notice: Subject to any disclaimer, the term of this patent is extended or adjusted under 35 U.S.C. 154(b) by 1173 days.

(21) Appl. No.: 11/200,258

(22) Filed: Aug. 9, 2005

(65) Prior Publication Data
US 2006/0132116 A1 Jun. 22, 2006

Related U.S. Application Data

(60) Provisional application No. 60/600,008, filed on Aug. 9, 2004.

(51) Int. Cl.
*H04L 25/49* (2006.01)
(52) U.S. Cl. ........ 375/293; 375/348; 375/354; 375/355; 375/357; 375/371
(58) Field of Classification Search .................. 375/293, 375/348, 354, 355, 357, 371
See application file for complete search history.

(56) References Cited

U.S. PATENT DOCUMENTS

| 5,854,809 | A | 12/1998 | Swanson et al. | |
|---|---|---|---|---|
| 6,055,117 | A * | 4/2000 | Hansen et al. | 360/45 |
| 7,295,604 | B2 * | 11/2007 | Cranford et al. | 375/226 |
| 7,363,563 | B1 * | 4/2008 | Hissen et al. | 714/733 |
| 7,388,937 | B1 * | 6/2008 | Rodger et al. | 375/348 |
| 2004/0136450 | A1 * | 7/2004 | Guenther | 375/226 |
| 2005/0152488 | A1 * | 7/2005 | Buckwalter et al. | 375/350 |
| 2005/0193290 | A1 * | 9/2005 | Cho et al. | 714/710 |
| 2005/0222789 | A1 * | 10/2005 | West | 702/79 |

FOREIGN PATENT DOCUMENTS

EP  1 014 362 A1  6/2000
WO  WO 03/050803 A2  6/2003

* cited by examiner

*Primary Examiner* — Chieh M Fan
*Assistant Examiner* — Siu Lee

(57) ABSTRACT

A method and system for removing the effect of intersymbol interference (ISI) from a data record indicating times of logic level transitions exhibited by a data signal that has been distorted by ISI exhibited by a system having a particular step response may perform the following acts. The data record may be received, and a transition from within the data may be selected record for removal of ISI. Preceding transitions within the data record are then inspected. A time defect is obtained, based at least in part upon the inspected preceding transitions. Finally, the data record is adjusted, based upon the time defect, to indicate a new time of transition for the selected transition, thereby removing the effect of ISI for the selected transition.

20 Claims, 20 Drawing Sheets

Maximum Offset at time t=1 = $d_{1,1} - d_{1(local\ maxima)} + d_{1(local\ minima)}$
Minimum Offset at time t=1 = $d_{1(local\ maxima)} - d_{1(local\ minima)}$ Maximum Offset at time t=2 = $d_{2,1} - d_{2,(local\ maxima)} + d_{2,(local\ minima)}$
Minimum Offset at time t=2 = $d_{2,(local\ maxima)} - d_{2,(local\ minima)}$

⋮

FOR A STEP RESPONSE HAVING A LENGTH OF 3 UI

WAVEFORM ANALYZER

CROSS REFERENCE TO RELATED APPLICATIONS

This application claims priority from provisional application Ser. No. 60/600,008, filed Aug. 9, 2004, and which is incorporated herein by reference.

FIELD OF THE INVENTION

The invention relates generally to waveform analyzers, and more particularly to equivalent-time and real-time waveform analyzers, and to oscilloscopes.

BACKGROUND

Waveform analyzers are devices that measure data signals in order to extract information. For example, a transmitting device may be coupled to a receiving device via a communication medium. In order to better understand the signal observed by the receiving device, a waveform analyzer may be coupled to the medium in place of the receiving device. The waveform analyzer may then be used to measure the data signal, in order to gather information. Examples of information determined by the wavefrom analyzer include statistical information regarding timing jitter and amplitude noise of the received data signal, bit error rate of the received data signal, and so on.

Traditionally, to expand the capabilities of waveform analyzers, new waveform analyzers are designed including general-purpose hardware that expensively and inefficiently addresses the problem of bit-error analysis. For example, a waveform analyzer may be used to record an infrequent bit error (or characteristic related to an error), so that the error or characteristic can be analyzed. Traditionally, this has been accomplished by instructing a transmitter to send data through a transmission medium, and by arranging a waveform analyzer on the other end of the medium. The waveform analyzer is programmed to oversample every bit it receives to obtain a long, highly resolved v(t) record that hopefully contains the bit error or characteristic. After the capacity of the waveform analyzer to store data is exhausted (i.e., the memory is "full"), the memory is examined to determine if the stored v(t) record exhibits the sought-after error or characteristic. If the error or characteristic occurs infrequently, it is quite likely that v(t) record does not exhibit the sought-after error or characteristic. This means that the procedure must be repeated until the v(t) record exhibits the sought-after error, or characteristic. Traditionally, this state of affairs has been improved by adding additional memory to the waveform analyzer. This method of addressing the aforementioned problem is costly, and does not directly address the principle of the problem.

The above-described scenario illustrates a broader point, namely, that there is a need for waveform analyzers to be improved according to a scheme that values efficiency. Such a scheme addresses three central issues: (1) how measurements are taken; (2) when measurements are taken; and (3) how information is extracted from the measurements. Each of these issues interrelate with one another. For example, how information is extracted from measurements is a function of, in part, when the measurements were taken. As more sophisticated methods of extracting information from measurements are developed, it may be possible to take fewer measurements without loss of information. A design that addresses these issues jointly may arrive at a cost-efficient solution to many forms of problems.

As alluded to above, there exists a need for a waveform analyzer that addresses performance and capability issues by examining those issues from the point of view of (1) how measurements are taken, (2) when measurements are taken, and (3) how information is extracted from those measurements. After consideration of performance and capability issues from those points of view, design choices may be made to address performance and capability issues in the least expensive manner.

SUMMARY OF THE INVENTION

Broadly speaking, the present application relates to a system for the reversal of intersymbol interference.

According to one embodiment, a method of removing the effect of intersymbol interference (ISI) from a data record indicating times of logic level transitions exhibited by a data signal that has been distorted by ISI exhibited by a system having a particular step response may be accomplished by performing the following acts. First, the data record is received. Thereafter, a transition may be selected from within the data record for removal of ISI. Preceding transitions within the data record may be inspected. A time defect may be obtained, based at least in part upon the inspected preceding transitions. Finally, the data record may be adjusted, based upon the time defect, to indicate a new time of transition for the selected transition, thereby removing the effect of ISI for the selected transition.

According to another embodiment, a method of determining a voltage of a signal at a particular point in time may include the following acts. First, the signal is received. A threshold that varies from a first voltage to a second voltage is generated. The first voltage is less than a minimum voltage expected to be exhibited by the received signal. The second voltage is greater than the maximum voltage expected to be exhibited by the received signal. The variation of the threshold exhibits a slope greater than a greatest slope expected to be exhibited by the received signal. The received signal is compared to the threshold, to determine a point in time at which the received signal exceeds the varied threshold.

According to yet another embodiment, a method of determining whether to take a measurement of a signal conveying digital information carried in a plurality of unit intervals may be accomplished by execution of the following acts. First the signal may be received. For a given unit interval, it is determined whether the signal exhibits a voltage greater than or less than a particular voltage level at a particular time relative to the given unit interval. It is decided whether to measure the signal, based upon the determination step.

According to another embodiment, a method of determining whether a symbol is aberrant may include the following acts. It is determined whether the symbol exhibits a voltage greater than a first voltage level at a first point in time relative to a the symbol. It is also determined whether the symbol exhibits a voltage less than a second voltage level at a second point in time relative to a the symbol. It is decided that the symbol is aberrant, based upon the determination steps.

According to yet another embodiment, a method of determining a maximum intersymbol interference exerted upon any symbol within a signal that has been acted upon by a system may include determining a length of a step response exhibited by the system. A shape of the step response is also determined. The maximum intersymbol interference is determined based upon the length and shape of the step response.

According to yet another embodiment, a method of determining standard deviation of a region of a probability density function presumed to be gaussian describing jitter or amplitude noise of a signal may include the following acts. A first probability that a feature of the signal exhibits a magnitude greater than or equal to a first chosen value is determined. A second probability that the feature of the signal exhibits a magnitude greater than or equal to a second chosen value is determined. A known quantity of noise is added to the signal, yielding a noise-enhanced signal. A first magnitude of the feature is determined, such that the noise-enhanced signal exhibits a probability of exhibiting the feature with a magnitude greater than or equal to the first magnitude equal to the first probability. A second magnitude of the feature is determined, such that the noise-enhanced signal exhibits a probability of exhibiting the feature with a magnitude greater than or equal to the second magnitude equal to the second probability. The standard deviation of the signal is determined, based upon the known quantity of noise, first and second chosen values, and first and second magnitudes.

DETAILED DESCRIPTION

The discussion herein initially addresses the issue of how an improved waveform analyzer may take measurements. Thereafter, the discussion moves on to address the issue of when the measurements are to be taken. Finally, the discussion turns to the issue of how to extract information from measurements. It is understood that one of the schemes disclosed herein may be employed without employment of any of the other schemes presented herein. For example, it is understood that a waveform analyzer may employ one of the schemes presented herein for extracting information from a set of measurements, without employing the schemes presented herein for obtaining the measurements, or for deciding when to take the measurements. Similarly, a waveform analyzer may employ one of the schemes presented herein for deciding when to take a measurement, without employing any of the schemes disclosed herein for taking a measurement. Thus, it is understood that the schemes presented herein may be employed separately or jointly.

It is commonplace for waveform analyzers to use one or more comparators to measure a signal. For example, a comparator may be used to determine the point in time at which a data signal crosses a particular voltage threshold. Per such a scenario, the comparator is arranged so that the static voltage threshold is provided at the negative input of the comparator, and the data signal is provided at the positive input of the comparator. Ideally, the comparator exhibits a transition to a high voltage at its output at the point in time that the data signal exceeds the threshold signal. A timing device may be coupled to the output of the comparator to determine the point in time at which the output of the comparator exhibits a high voltage. Thus, a voltage-time pair may be arrived at.

The aforementioned arrangement exhibits certain shortcomings, however. If the data signal only slightly exceeds the threshold, the output of the comparator may exhibit a prolonged delay period before transitioning to the high voltage state. Additionally, it is possible that the output of the comparator may not transition to a high voltage state at all. Of course, since the output of the comparator is the basis used by the remainder of the waveform analyzer for obtaining the voltage-time pair, either outcome is inimical to the goal of accurate measurement. Furthermore, if the data signal exhibits an insufficient slew rate (i.e., consumes a great deal of time in crossing the threshold), the output of the comparator may exhibit a prolonged delay period before transitioning to the high voltage state. Again, this outcome is inimical to the goal of accurate measurement.

Figure 1:
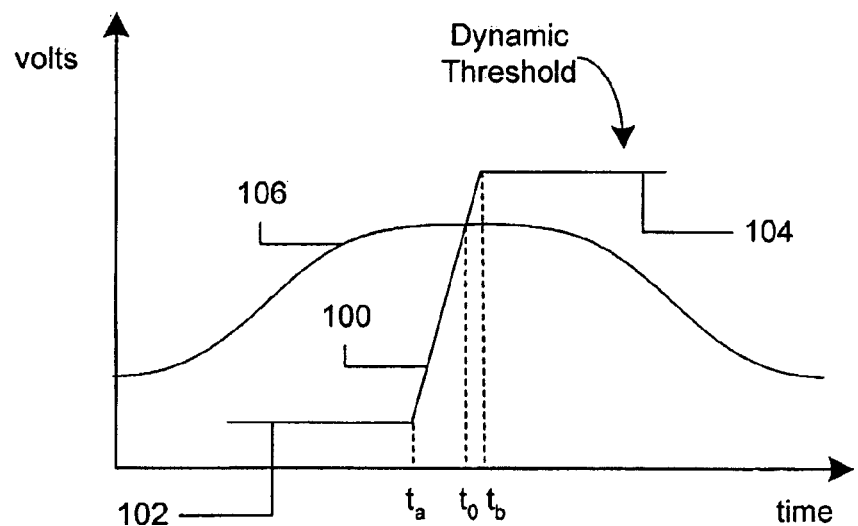
FIG. 1 depicts a scheme that employs a dynamic threshold, according to one embodiment of the present invention.

FIG. 1 depicts a scheme that employs a dynamic threshold 100. As can be seen from FIG. 1, the threshold 100 transitions from a low voltage 102, at time $t_a$, to a high voltage 104, at time $t_b$. The threshold 100 crosses the data signal 106 at time $t_0$. Because the dynamic threshold 100 swings between the low voltage level 102 and the high voltage level 104 between times $t_a$ and $t_b$, the circuit yields a voltage-time pair that relates a voltage value and a time value between $t_a$ and $t_b$. In other words, it is known that $$t_a \leq t_0 \leq t_b.$$

The dynamic threshold 100 swings from the low voltage level 102 to the high voltage level 104 traveling along substantially the same path each time. Thus, knowledge of when the dynamic threshold began traversing its path from the low voltage level 102 to the high voltage level 104 combined with knowledge of when the dynamic threshold 100 crossed the data signal 106 allows for knowledge of the voltage of the data signal 106 at time $t_0$. It is possible to determine a voltage-time pair on the basis of this knowledge, as well, as is discussed with reference to FIG. 3, below.

Figure 2:
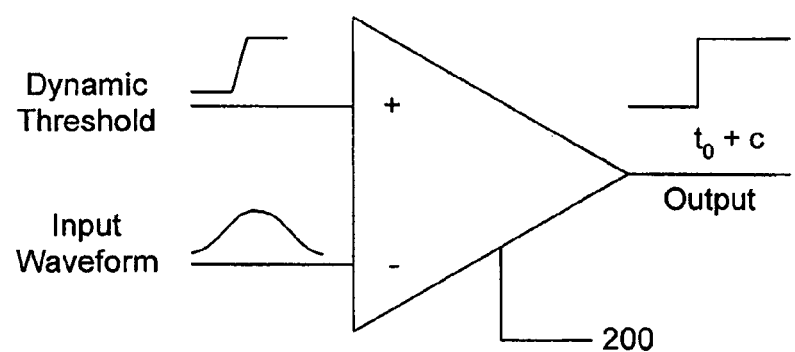
FIG. 2 depicts a hardware arrangement for employing the scheme depicted in FIG. 1, according to one embodiment of the present invention.

As shown in FIG. 2, a comparator 200 may employ the dynamic threshold 100 at its positive input, and may employ the data signal 106 as its negative input. Thus, at some point shortly after $t_0$ (represented as $t_0+c$), the output of the comparator 200 transitions to logic-level high. The output of the comparator 200 is used as a basis for generating a voltage-time pair, as discussed below with respect to FIG. 3.

The threshold 100 is chosen so as to exhibit certain qualities, so that the aforementioned scheme works successfully. The low voltage and high voltage levels 102 and 104 are chosen so that low voltage level 102 is considerably less than the lowest voltage level of the data signal 106, and so that the high voltage level 104 is considerably greater than the highest voltage level of the data signal 106. By this, it is meant that the dynamic threshold 100 has a voltage range that ensures sufficient overdrive. This ensures that the aforementioned problems associated with insufficient overdrive are avoided. Furthermore, the rate of change of the threshold 100 is chosen to greatly exceed that of the data signal 106. This ensures that the rate at which the threshold 100 exceeds the data signal 106 is sufficiently fast that the aforementioned problems associated with insufficient slew rate are avoided.

Figure 3:
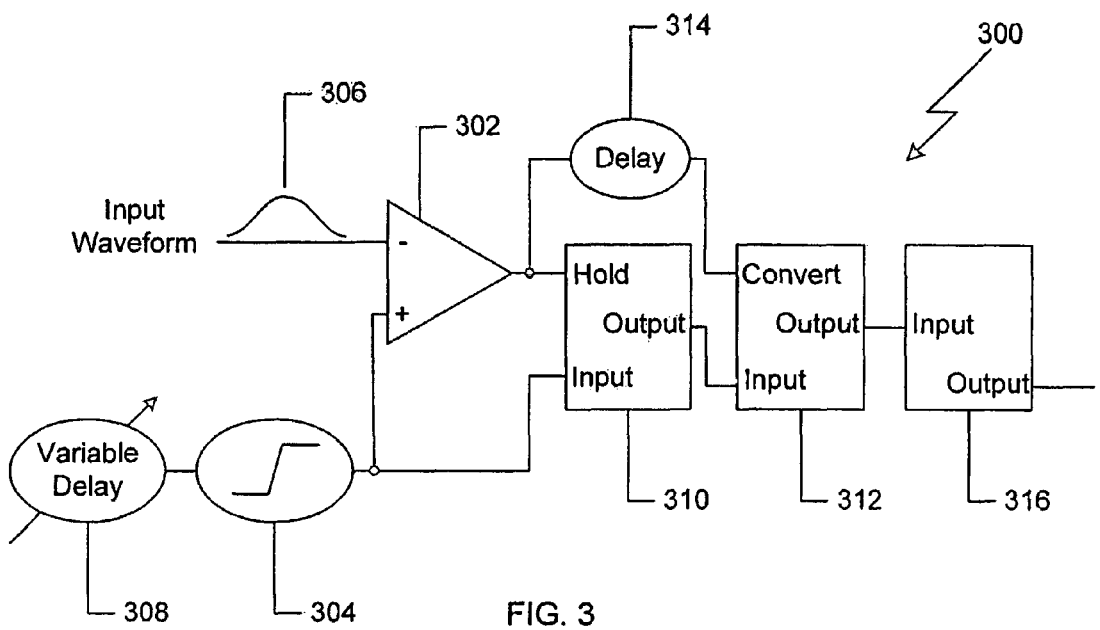
FIG. 3 depicts a circuit that uses the dynamic threshold concept presented in FIGS. 1 and 2 to determine a voltage-time pair, according to one embodiment of the present invention.

FIG. 3 depicts a circuit 300 that uses the dynamic threshold concept presented in FIGS. 1 and 2 to determine a voltage-time pair. As depicted in FIG. 3, the circuit 300 includes a comparator 302. As in the circuit of FIG. 2, the comparator 302 has a dynamic threshold signal source 304 coupled to its positive input and a data signal source 306 coupled to its negative input. The dynamic threshold signal source 304 is triggered by a variable delay element 308, meaning that the dynamic threshold signal source 304 does not begin to provide the positive-going threshold to the comparator 302, until excited by an impetus from the variable delay element 308. Thus, by controlling the variable delay element 308, it is possible to orient $t_a$ and $t_b$ (FIG. 1), which form the outside time boundaries between which a voltage-time pair is determined, at different points along the data signal 106 (FIG. 1). The delay element 308 may be provided a signal derived from a recovered clock signal (discussed below) or other synchronized signal, so that the dynamic threshold source 304 begins its operation at a point in time derived from the incoming data signal, itself.

The output of the comparator 302 is provided to the hold pin of a track-and-hold element 310, which means that when the output of the comparator 302 is asserted (logic-level high), the track-and-hold element 310 will hold on its output pin the voltage observed on its input pin. As can be seen, the dynamic threshold source 304 is coupled to the input pin of the track-and-hold element 310. Thus, when the output of the comparator 302 is asserted, the track-and-hold element 310 captures the voltage of the dynamic threshold signal, and holds that voltage on its output pin. If the comparator 302 were an ideal element, the output of the track-and-hold element 310 would hold the exact voltage at which the threshold signal 100 (FIG. 1) crossed the data signal 106 (FIG. 1). However, in actuality, the comparator 302 asserts at some point following the threshold signal 100 (FIG. 1) crossing the data signal 106 (FIG. 1). This point in time is represented by $t_0+c$ (FIG. 2). Thus, at time $t=t_0+c$, the latch 310 holds the voltage value exhibited by the dynamic threshold source 304 at time $t=t_0+c$. Thus, although the track-and-hold element 310 does not hold the voltage level at time $t=t_0$ (FIG. 1), it does hold a voltage level that exhibits a one-to-one correspondence with the voltage level at time $t=t_0$ (FIG. 1).

The output of the track-and-hold element 310 is coupled to the input pin of an analog-to-digital converter 312. The analog-to-digital converter 312 generates a digital representation of the voltage presented at its input pin when the signal on its "convert" pin is asserted (logic-level high). The output of the comparator 302 is coupled, through a delay element 314, to the aforementioned "convert pin." The delay element 314 delays the propagation of the signal from the comparator 302 to the track-and-hold element 310 by a span of time at least as long as the propagation delay of the track-and-hold element 310. Thus, when the logic-level high signal arrives at the "convert" pin, the voltage from the track-and-hold element 310 is already provided at the input pin of the analog-to-digital converter 312.

The output of the analog-to-digital converter 312 is provided to a look-up table 316. The look-up table 316 uses the digital signal provided by the analog-to-digital converter 312 as an index variable to look up a value from a table. The value that is looked up is the voltage level at which the threshold signal 100 (FIG. 1) crossed the data signal 106 (FIG. 1). This is possible because the track-and-hold element 310 holds a voltage level that exhibits a one-to-one correspondence with the voltage level at time $t=t_0$ (FIG. 1). Thus, the output of the look-up table 316 is the voltage level at which the threshold signal 100 (FIG. 1) crossed the data signal 106 (FIG. 1). In sum, the circuit 300 of FIG. 3 determines a voltage-time pair in which the time value, $t_0$, is bounded between $t_a$ and $t_b$. If $t_a$ and $t_b$ are sufficiently proximate, the circuit 300 can be said to measure a voltage at an approximate point in time.

Figure 4:
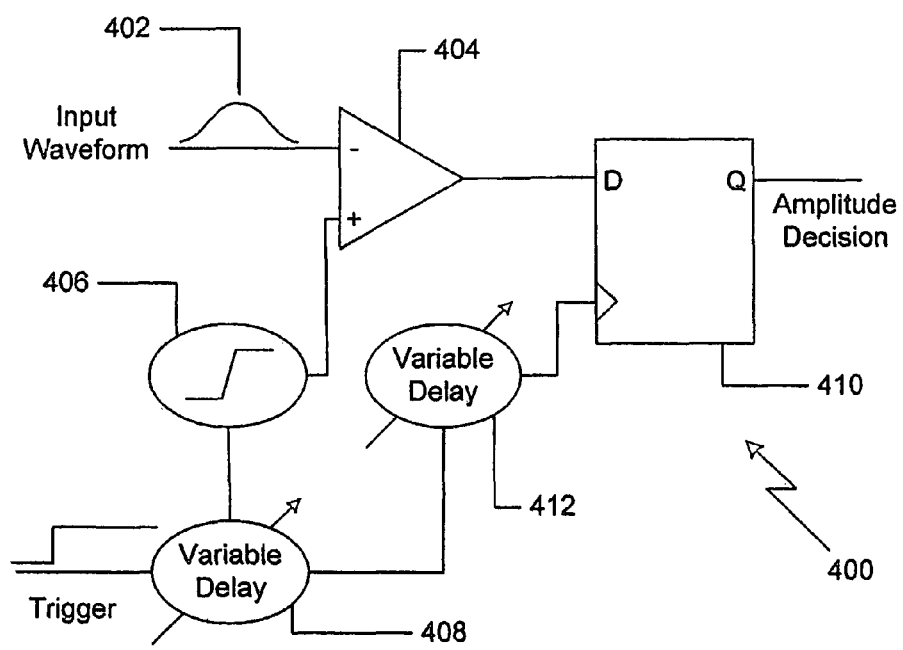
FIG. 4 depicts a circuit that uses the dynamic threshold concept presented in FIGS. 1 and 2 to determine whether a data signal is above or below a particular voltage at a particular point in time, according to one embodiment of the present invention.

FIG. 4 depicts a circuit 400 that uses the dynamic threshold concept presented in FIGS. 1 and 2 to determine whether a data signal 402 is above or below a particular voltage at a particular point in time. This circuit 400 may be referred to herein as a "discriminator circuit." As depicted in FIG. 4, the discriminator 400 includes a comparator 404. As in the circuits of FIGS. 2 and 3, the comparator 404 has a dynamic threshold signal source 406 coupled to its positive input and a data signal source 402 coupled to its negative input. The dynamic threshold signal source 406 is triggered by a variable delay element 408, meaning that the dynamic threshold signal source 406 does not begin to provide the positive-going threshold to the comparator 404, until excited by an impetus from the variable delay element 408. In this case, the impetus is a trigger or step signal that propagates through the delay element 408.

The output of the comparator 404 is provided to the "D" input of a flip-flop 410. This particular variety of flip-flop 410 operates such that its output is held at logic-level high, if a logic-level high is provided at the "D" input, at the time its clock pin asserted. Conversely, its output is held at logic-level low, if a logic-level low is provided at the "D" input, at the time its clock pin asserted.

The output of the variable delay element 408 is delivered to a second variable delay element 412. The second variable delay element 412 determines the particular voltage level that is tested for by this circuit 400, as explained below. The output of the second delay element 412 is coupled to the clock input of the flip-flop 410.

Reflection upon the circuit 400 of FIG. 4 reveals that the dynamic reference source 406 begins its operation at the same time that the second variable delay element 412 commences its delaying action. When the delay period of the second delay element 412 has elapsed, the flip-flop 410 will hold either a logic-level high or a logic-level low on its output. At the time of the elapsing, the dynamic reference source 406 will exhibit a predictable voltage—a voltage that is a function of the delay period exhibited by the second variable delay element 412. If the data source 402 exhibits any voltage level less than the voltage level exhibited by the dynamic reference source 406 at the elapsing of the delay period exhibited by the second delay element 412, a logic level high will be yielded on the output pin of the comparator 404, and the flip-flop 410 will therefore generate a logic-level high as its output. On the other hand, if the data source 402 exhibits any voltage level greater than the voltage level exhibited by the dynamic reference source 406 at the elapsing of the delay period exhibited by the second delay element 412, a logic level low will be yielded on the output pin of the comparator 404, and the flip-flop 410 will therefore generate a logic-level low as its output. Thus, the discriminator circuit 400 of FIG. 4 generates an output (a "1" or a "0") that indicates whether the data signal 402 is greater than or less than a particular voltage (determined by the second delay element 412) at a particular point in time (determined jointly by the first and second delay elements 408 and 412).

The foregoing discussion has related to measurement circuits 300 (FIG. 3) and 400 (FIG. 4) that form portions of the improved waveform analyzer discussed herein. As can be seen, the aforementioned circuits 300 (FIG. 3) and 400 (FIG. 4) require trigger signals, which determine when the dynamic threshold signal begins its rising action, and ultimately determines when a measurement is taken. The following discussion relates to issues regarding when measurements should be taken, and bears relevance to generation of the trigger signals. The following discussion refers back to the circuits 300 (FIG. 3) and 400 (FIG. 4), where appropriate. Of course, the following discussion involves principles that may be employed by a waveform analyzer that does not utilize either of the circuits 300 (FIG. 3) or 400 (FIG. 4).

Figure 5:
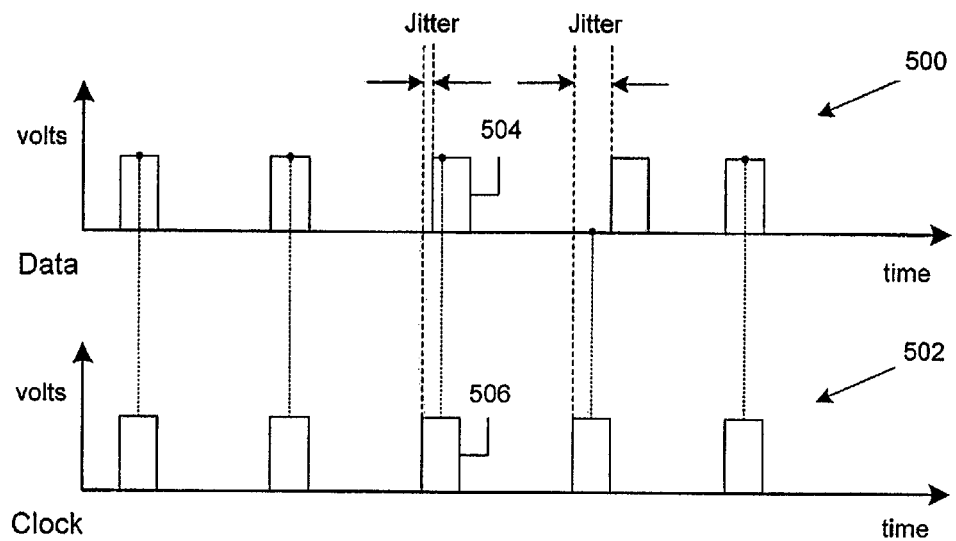
FIG. 5 depicts a recovered clock signal and a data signal exhibiting timing jitter.

FIG. 5 depicts timing jitter, as observed by a receiver (not depicted). Depicted therein is a data signal 500 and a recovered clock signal 502. Ideally, the data signal 500 is substantially synchronized with the recovered clock signal 502. However, as can be seen from FIG. 5, the rising edge of data bit 504 does not align with the rising edge of the recovered clock pulse 506. Instead, the rising edge of the data bit is tardy. A discrepancy between a recovered clock signal and a data signal is referred to as "timing jitter." Timing jitter, if sufficiently severe, may cause a receiver to mistakenly identify a "1" as a "0," or vice versa.

Figure 6:
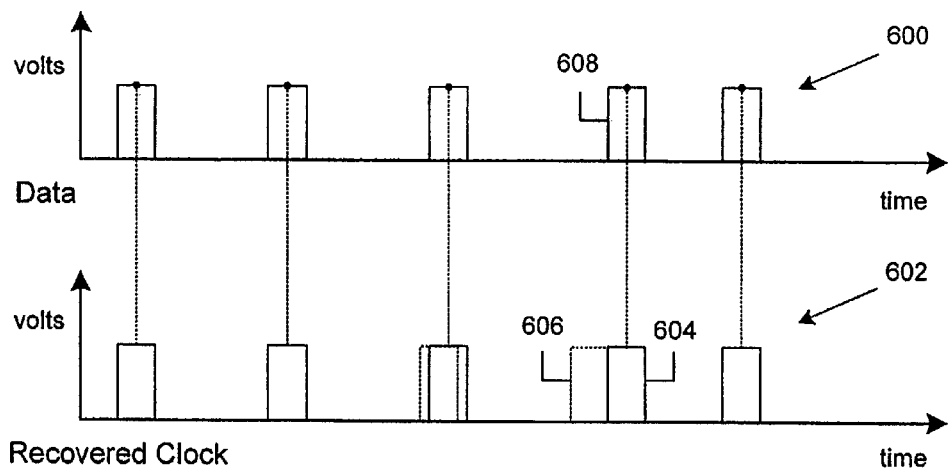
FIG. 6 depicts a recovered clock signal and a data signal exhibiting irregular bit spacing. Herein, the clock signal is tracking the data signal.

FIG. 6 depicts a data signal 600 and a recovered clock signal 602. As can be seen, the data pulses within the data signal 600 occur at irregular intervals. Thus, one might expect a receiver of such a pulse to observe timing jitter, as was the case in FIG. 5. However, the recovered clock signal 602 depicted in FIG. 6 also contains pulses occurring at irregular intervals. The recovered clock signal 602 literally "jitters with" the data signal 600. Therefore, no timing jitter is observed by the receiver. For example, if clock pulse 604 were located at its "ideal" location 606 (so that the recovered clock pulses would occur at regular intervals), the receiver would observe timing jitter. In fact, the timing jitter observed would have been so severe that data pulse 608 would have been misinterpreted as a "0," instead of a "1." Instead, as stated above, because the recovered clock signal 602 literally "jittered with" the data signal 600, no timing jitter is observed at all.

The phenomenon depicted in FIG. 6 presents a challenge to typical waveform analyzers. It is commonplace for a waveform analyzer to be used to determine the timing jitter observed by a receiver. Usually, the waveform analyzer is coupled to the transmission medium in place of the receiver, and therefore receives the incoming data that would have been received by the receiver. The waveform analyzer then measures the timing jitter it observes in the incoming data. The assumption operating silently in this method is that the timing jitter observed by the waveform analyzer is the same as that which would have been observed by the receiver. Unfortunately, FIG. 6 illustrates the principle that the timing jitter observed by a receiver is a function of its clock recovery. Therefore, if a waveform analyzer and a receiver do not have substantially similar clock recovery functions, the timing jitter observed by the waveform analyzer will not be substantially similar to that observed by the receiver. This means that the waveform analyzer should not be used to accurately measure timing jitter observed by the receiver.

Figure 7:
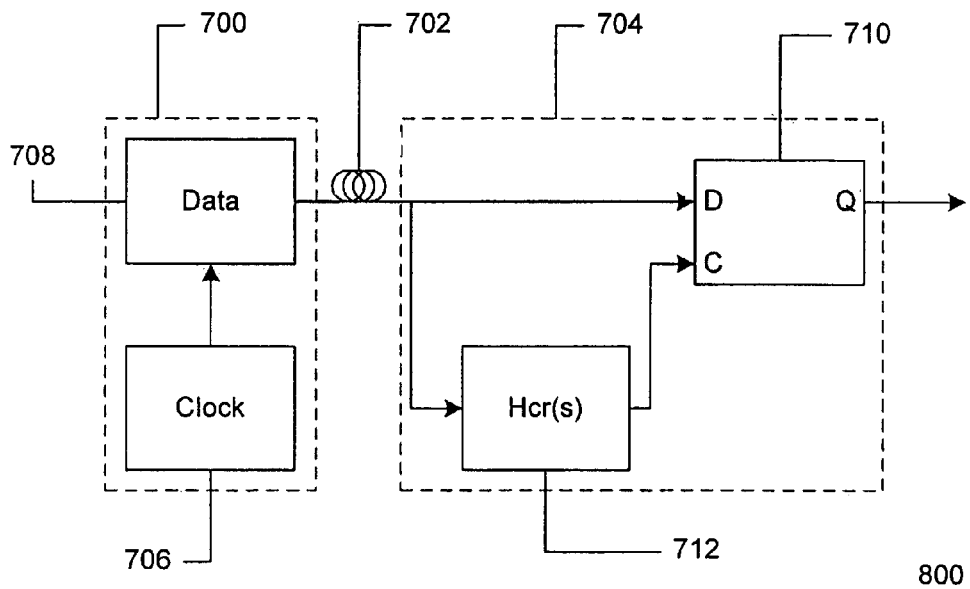
FIG. 7 depicts a receiver having a clock recovery circuit with a transfer function Hcr(s).

FIG. 7 presents an understanding of the aforementioned principle from a mathematical point of view. FIG. 7 depicts a transmitter 700, a transmission medium 702, and a receiver 704. The transmitter 700 includes a clock 706 and a data source 708. With each clock pulse, a data bit is transmitted from the data source 708, through the transmission medium 702, and is received by the receiver 704.

The receiver 704 includes a flip-flip 710 and a clock recovery circuit 712. The flip-flop 710 works in the same manner as the flip-flop 410 described with reference to FIG. 4. As suggested by FIG. 7, the clock recovery circuit 712 may be embodied as a phase-lock loop, and can be thought to exhibit behavior described by a transfer function denoted as Hcr(s), where $s=j\omega$, and where $j=(-1)^{1/2}$ and $\omega$=angular frequency measured in radians per second. Thus, it follows from this view of the receiver 704 that the recovered clock signal does not perfectly "jitter with" the data signal carried along the transmission medium 702 (as was the case in the example shown in FIG. 6). Rather, the recovered clock signal is a function of the transfer function of the clock recovery system 712. Typically, this means that the recovered clock signal follows the data signal in a time-averaged sense, but does not follow the data signal from bit to bit.

Figure 8:
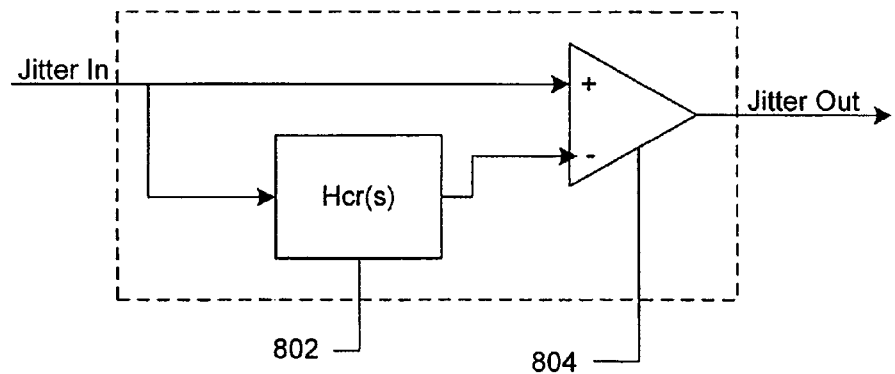
FIG. 8 depicts a scheme whereby jitter in a receiver employing a clock recovery circuit having a transfer function of Hcr(s) may be found.

Given the understanding of the receiver presented in FIG. 7, one may find the timing jitter observed by the receiver 704 by use of the system 800 presented in FIG. 8. The system 800 of FIG. 8 includes a circuit 802 exhibiting the same transfer function as that of the clock recovery circuit 712 within the receiver 704 in FIG. 7. The system 800 also includes a difference node 804, which yields an output equal to the difference between its two inputs.

A signal exhibiting "absolute timing jitter" may be provided to the system of FIG. 8, with the result being that the output of the summer 804 exhibits the timing jitter observed by the receiver 704 of FIG. 7. The term "absolute timing jitter" refers to a signal, or data sequence, describing the jitter exhibited by each data pulse in the data stream received by the receiver 704, as measured against an ideal point in time when the data pulse should be exhibited—not as measured against the recovered clock signal. If the absolute timing jitter is denoted as x(t), then the output, y(t), of the system 800 of FIG. 8 is:

$$y(t)=x(t)-x(t)*Hcr(t)$$

where the symbol "*" refers to time-domain convolution, as opposed to multiplication. Stated in frequency space, the output of the system 800 of FIG. 8 is:

$$y(s)=x(s)[1-Hcr(s)]$$

The system of FIG. 8 may be implemented in hardware or in software. Further, although the system of FIG. 8 has been expressed in mathematics referring to continuous time, the system may be implemented in a discrete time environment, as well.

Figure 9:
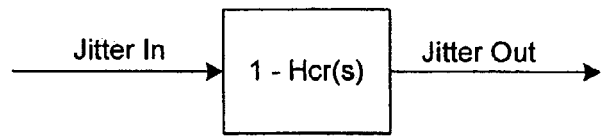
FIG. 9 depicts another scheme whereby jitter in a receiver employing a clock recovery circuit having a transfer function of Hcr(s) may be found.

FIG. 9 expresses the system 800 of FIG. 8 as a single circuit having a transfer function of 1−Hcr(s), which is the transfer function realized by the system 800 of FIG. 8. Of course, the system of FIG. 9 may be implemented in software, as well as in hardware.

The principle expressed through FIGS. 7, 8, and 9 is that a waveform analyzer may accurately measure the timing jitter observed by a receiver, if it implements the same clock recovery function as is implemented by the receiver. To that end, the waveform analyzer may be programmed to contain software that emulates the clock recovery functions of various receivers, or may contain circuitry that may be put in various states, so as to emulate the clock recovery functions of various receivers. Prior to execution of a timing jitter measurement function, the waveform analyzer may inquire about the identity of the receiver. Then, the waveform analyzer either invokes a software routine to emulate the clock recovery function of the receiver, or provides inputs into a clock recovery circuit, so that the circuit enters a state whereby it emulates the clock recovery circuit of the receiver. Alternatively, the waveform analyzer may be programmed to contain software that permits a user to enter the poles and zeros of the transfer function of the clock recovery circuit in the receiver. After entry of the poles and zeros, the waveform analyzer either invokes a software routine to emulate the clock recovery function of the receiver, or provides inputs into a clock recovery circuit, so that the circuit enters a state whereby it emulates the clock recovery circuit of the receiver.

Figure 10:
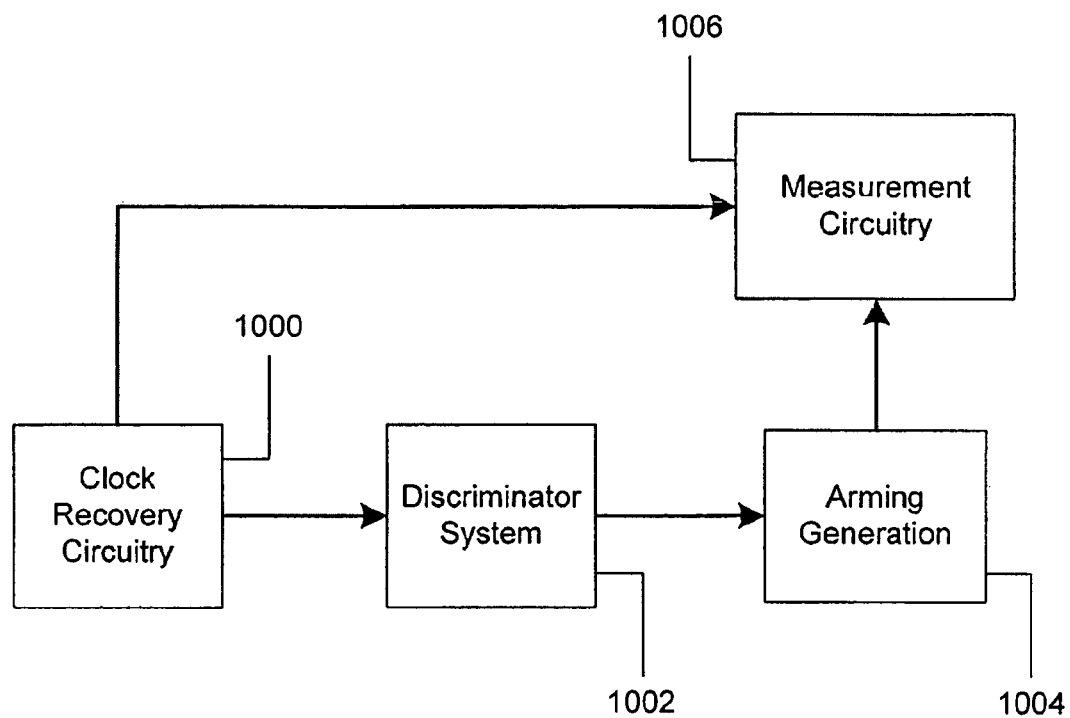
FIG. 10 depicts an arrangement of circuitry that uses the recovered clock signal as a timing base, according to one embodiment of the present invention.

As depicted by FIG. 10, an improved waveform analyzer may include a clock recovery circuitry 1000, which generates a recovered clock signal, as described above. The recovered clock signal may be provided to a discriminator system 1002, which may include several discriminator circuits 400 (Figure) and logic, as discussed with reference to FIG. 11. The discriminator system 1002, by virtue of being provided with the recovered clock signal makes its discrimination choices based upon the same information that a receiver would have observed (this is true if the waveform analyzer's clock recovery circuit 1000 is substantially similar to that of the receivers, as discussed with reference to FIGS. 7-9).

The output of the discriminator system 1002 indicates whether, from a discrimination point of view, a measurement should be taken. The information is supplied to an arming generation system 1004. The arming generation system 1004 combines the information supplied from the discriminator system 1002 with other arming information (such as pattern matching) to make a final determination whether a measurement should be taken. For example, the waveform analyzer may be configured to take a measurement of the fourth bit in a 50-bit sequence, if certain voltage discrimination conditions are satisfied. The discriminator system indicates whether the voltage discrimination conditions are satisfied, and supplies a true/false indicator to the arming generation system 1004. The arming generation system 1004 determines whether the particular bit presently being analyzed is indeed the fourth bit in the 50-bit sequence. If both queries are true, then, the arming generation circuit sends a take-measurement signal to the measurement circuitry 1006.

The measurement circuitry 1006 may be embodied as measurement circuit 300 (FIG. 3), or may be embodied as another circuit. Notably, the measurement circuit 1006 is provided with the recovered clock signal, meaning that the timing of the measurement it takes is based off of the data signal it is measuring, and emulates that which would be taken by the receiver (again, assuming that the clock recovery circuit 1000 is substantially similar to that employed by the receiver).

The preceding discussions relating to FIGS. 5-10 have concerned issues relating to the how the timing of measurements should be determined. The following discussion relates to determining whether or not a measurement should be taken at all.

Figure 11:
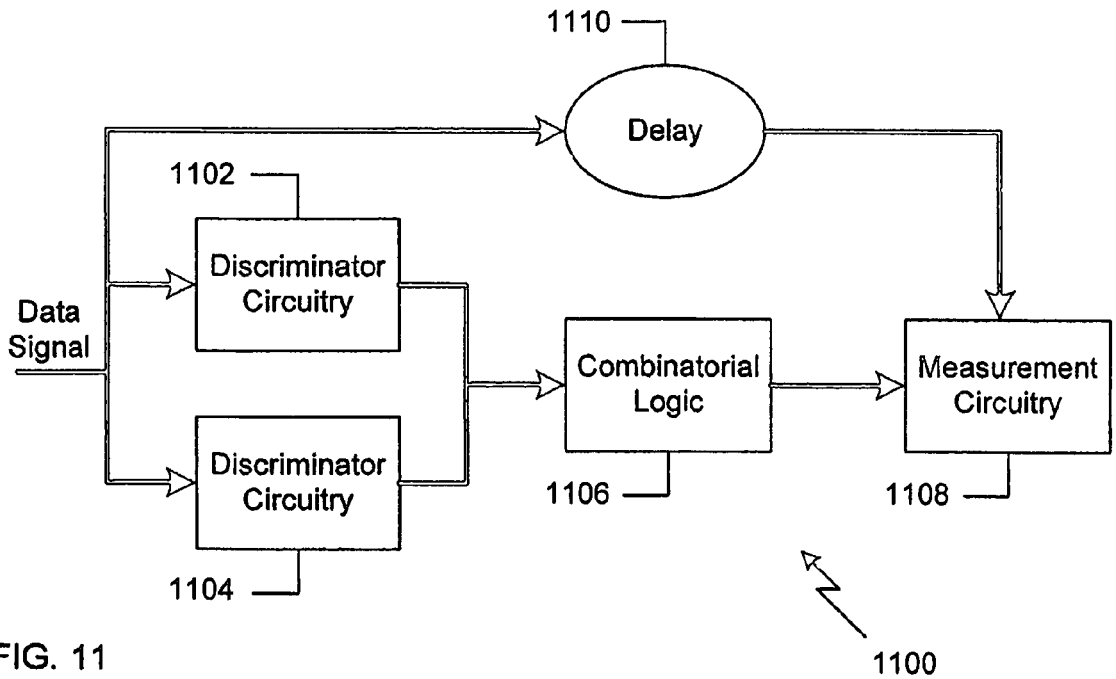
FIG. 11 depicts a system having a plurality of discriminators, so that a measurement may be taken only if a set of discrimination conditions is satisfied, according to an embodiment of the present invention.
Figure 14:
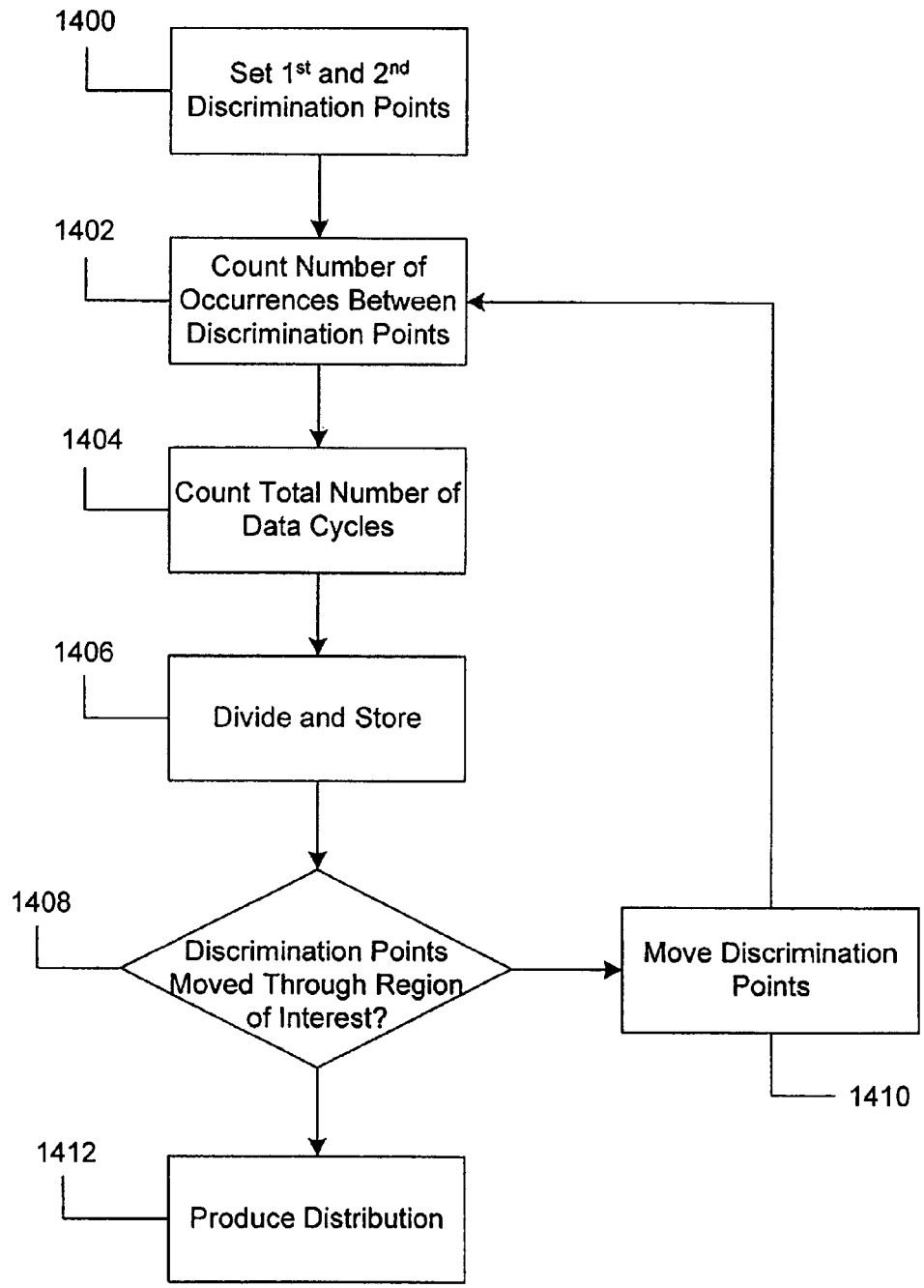
FIG. 14 depicts a scheme by which a discrimination system may be employed to determine a probability density function, according to one embodiment of the present invention.

As alluded to in the Background section herein, a waveform analyzer may be used to record an infrequent bit error or characteristic, so that the error or characteristic can be analyzed. Traditionally, this has been accomplished by instructing a transmitter to send data through a transmission medium, and by arranging a waveform analyzer on the other end of the medium. The waveform analyzer is programmed to oversample every bit it receives to obtain a long, highly resolved v(t) record that hopefully contains the bit error or characteristic. After the capacity of the waveform analyzer to store data is exhausted (i.e., the memory is "full"), the memory is examined to determine if the stored v(t) record exhibits the sought-after error or characteristic. If the error or characteristic occurs infrequently, it is quite likely that v(t) record does not exhibit the sought-after error or characteristic. This means that the procedure must be repeated until the v(t) record exhibits the sought-after error, or characteristic. Traditionally, this state of affairs has been improved by adding additional memory to the waveform analyzer. However, the following system depicted in FIG. 11 provides a scheme for deciding if an incoming symbol exhibits a set of characteristics indicating that the a measurement should be taken. If so, a measurement is taken. If not, no measurement is taken. A benefit of the system of FIG. 11 is that only symbols exhibiting a sought-after aberration are measured, meaning that the waveform analyzer does not fill its memory with samples from "normal" bits. Another benefit of the system of FIG. 11 is that a set of characteristics can be defined, so as to declare a bit aberrant without a priori knowledge of whether the bit was to be a "1" or a "0."

The discriminator 400 of FIG. 4 may be used as a part of a system 1100 (FIG. 11) that determines whether or not a measurement should be taken. The system 1100 of FIG. 1100 includes a first discriminator circuit 1102 and a second discriminator circuit 1104. As was discussed with reference to FIG. 4, the output of a discriminator circuit may take on one of two states: a "0" if the voltage of the data signal is higher than a particular voltage at a particular time, or a "1" if the voltage of the data signal is less than a particular voltage level at a particular time.

Figure 12:
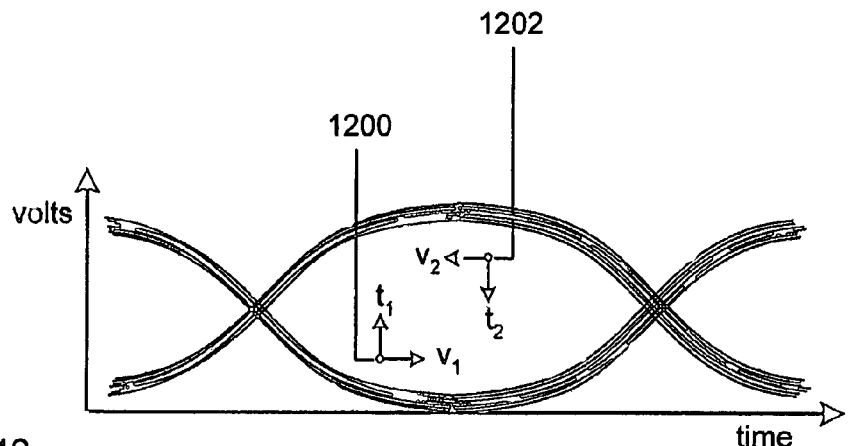
FIG. 12 depicts an eye diagram with a pair of discrimination points inserted therein, according to an embodiment of the invention.
Figure 13:
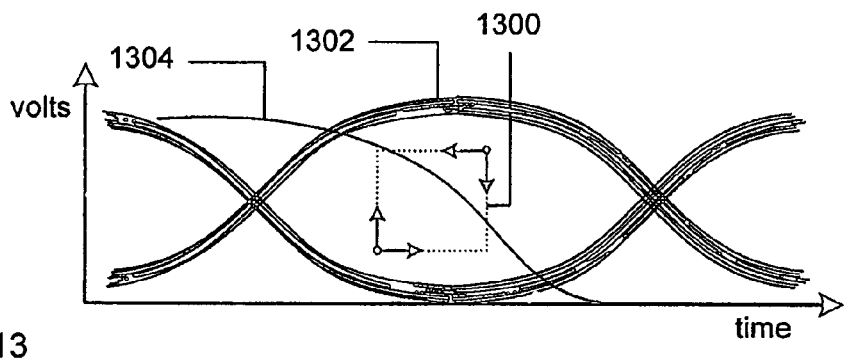
FIG. 13 depicts another eye diagram with a pair of discrimination points inserted therein, according to an embodiment of the invention.

A data signal is provided to each of the first and second discriminators 1102 and 1104. Thus, each discriminator 1102 and 1104 yields a "1" or a "0" depending upon whether the data signal is above or below a particular voltage level at a particular time. As shown in FIG. 12, the first discriminator 1102 may be set to test whether the voltage level of the data signal is greater than $v_1$ at time $t=t_1$. Similarly, the second discriminator 1104 may be set to test whether the voltage level of the data signal is less than $v_2$ at time $t=t_2$. If both discriminators assert, it is known that the data signal entered the region 1300 in FIG. 13. As indicated by the eye diagram, a properly contoured data signal should never enter region 1300. Thus, assertion of both discriminators 1102 and 1104 indicates that the data signal is aberrant. Notably, the discriminator 1102 and 1104 can describe a symbol as aberrant without a priori knowledge regarding whether the symbol was to represent a "1" or a "0." Accordingly, the waveform analyzer may take a measurement of the abberant signal. To achieve this end, the outputs of the first and second discriminators 1102 and 1104 are provided to a system of combinatorial logic 1106. In this case, the combinatorial logic 1106 is designed to yield a "1" if the discriminators 1102 and 1104 indicate that the data signal was above voltage level $v_1$ at time $t_1$ and below voltage level $v_2$ at time $t_2$, and to yield a "0" otherwise. The output of the combinatorial logic 1106 is provided to a measurement circuit 1108 (which may be embodied as measurement circuitry 300 in FIG. 3 or measurement circuitry 400 in FIG. 4, or which may be embodied as another measurement circuit). The measurement circuit 1108 conditions its own execution upon the output of the combinatorial logic 1106, meaning that a measurement is taken only if the output of the combinatorial logic is asserted.

As can be seen from FIG. 11, the data signal is routed through a delay element 1110 on its way to the measurement circuitry. The delay exhibited by the delay element is at least as long as the propagation delay of the discriminator circuit 1102 or 1104 and the combinatorial logic 1106, so that the output of the combinatorial logic arrives at the measurement circuit 1108 at the same time as, or prior to, the arrival of the data signal.

Although the system 1100 of FIG. 11 is depicted as having two discriminator circuits 1102 and 1104, the system may have any number of discriminator circuits 1102 and 1104, in principle. Furthermore, the discriminator circuits 1102 and 1104 and combinatorial logic 1106 may be arranged to test for any combination of conditions, providing great flexibility.

One benefit of the aforementioned system 1100 relates to an issue specifically identified in the Background section of this application: a waveform analyzer may "run out" of memory prior to measuring an infrequent error, if the waveform analyzer oversamples every data bit in order to find one errant bit. The system 1100 of FIG. 11 achieves a result whereby a measurement is taken only if a set of conditions is satisfied. By crafting the conditions such that they are satisfied only if an infrequent bit error is exhibited or only if an infrequent characteristic is exhibited, one can be assured that the measurements held in the memory of the waveform analyzer relate exclusively to bits exhibiting the infrequent bit error or characteristic.

Figure 15A:
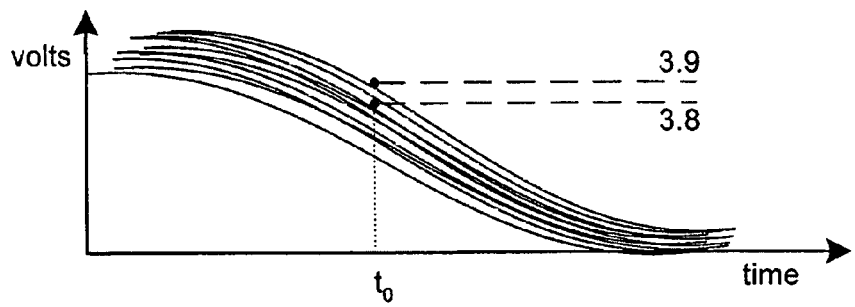
FIGS. 15A-15C depict a set of transitions through which a pair of discrimination points are stepped.
Figure 15B:
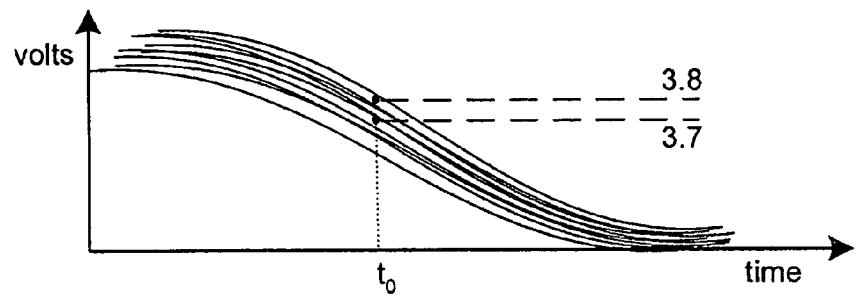
Figure 15C:
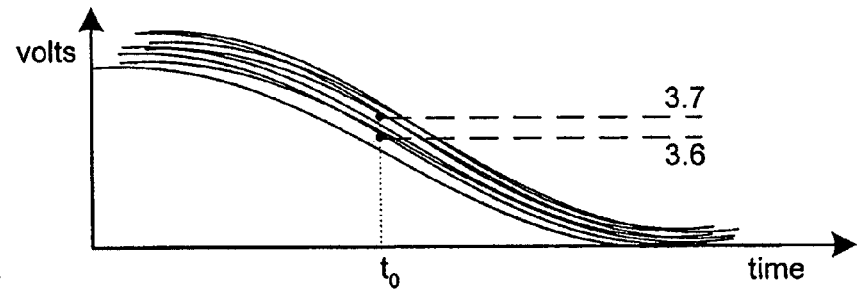

As described with reference to FIGS. 14 and 15A-15D, the system 1100 of FIG. 11 can be used to determine a probability density function. For example, turning to FIGS. 15A-15C, depicted therein is a set of ten transitions from a high voltage to a low voltage. For the sake of illustration, it is assumed that the high voltage is 5 volts, and the low voltage is 0 volts. FIGS. 15A-15C depict the case where a probability density function describing the voltage exhibited by the data signals at time $t=t_0$ is desired.

Jointly referring to FIGS. 14 and 15A-15C, the first step in producing such a probability distribution function is to set first and second discrimination points, as shown in operation 1400. For example, as shown in FIG. 15A, the first discrimination point is set at 3.9 volts and time $t=t_0$, while the second discrimination point is set at 3.8 volts and time $t=t_0$. Thereafter, the waveform analyzer collects a number of transitions (in this case, ten transitions). The number of transitions occurring between the discrimination points is counted, as described in operation 1402. With respect to the example depicted in FIG. 15A, two such transitions are counted. Also, the total number of transitions is counted, as described in operation 1404. Thereafter, the total number of transitions exhibiting a voltage between the discrimination points is divided by the total number of transitions counted in operation 1404. With respect to the example shown in FIG. 15A, the resulting calculation is 2/10. This figure is stored, as shown in operation 1406. Thus, it is known that at time $t=t_0$, there is a 20% chance of a data signal exhibiting a voltage between 3.8 and 3.9 volts.

Figure 15D:
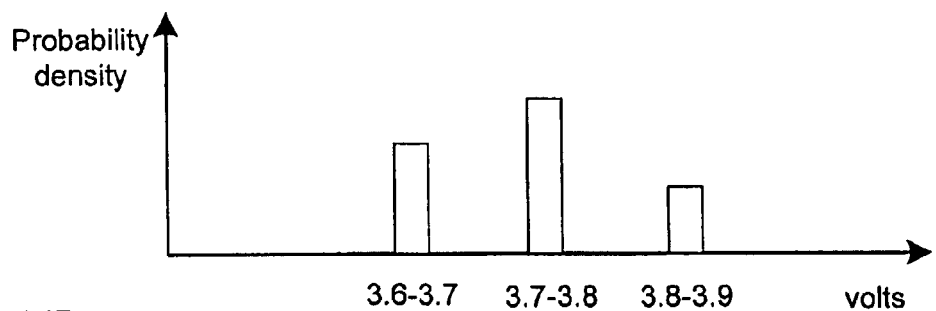
FIG. 15D depicts a probability density function arrived at from the transitions depicted in FIGS. 15A-15C.

Thereafter, in operation 1408, it is determined whether the discrimination points have been moved through the region of interest. For example, if the probability density function is to present probability for a range of voltage between 3.6 volts and 3.9 volts, and if the discrimination points have thus far only been set to 3.8 and 3.9 volts, then the answer to this query is negative. As a result, the discrimination points are moved, as shown in operation 1410. As depicted in FIG. 15B, the discrimination points may be moved to 3.7 and 3.8 volts. Thereafter, operations 1402-1408 are executed again, resulting in a determination that, at time $t=t_0$, there is a 40% chance of a data signal exhibiting a voltage between 3.7 and 3.8 volts. Again, assuming a region of interest being 3.6-3.9 volts, operation 1410 is again executed. This time, the discrimination points are moved to 3.6 and 3.7, as shown in FIG. 15C. Thereafter, operations 1402-1408 are executed again, resulting in a determination that, at time $t=t_0$, there is a 40% chance of a data signal exhibiting a voltage between 3.7 and 3.8 volts. In operation 1408, it is determined that the discrimination points have been moved through the region of interest (i.e., they moved through the entire range beginning at 3.9 volts and ending at 3.6 volts). Thus, control is passed to operation 1412, in which the probability distribution function is created. An example of the probability distribution function created in operation 1412 is shown in FIG. 15D. Of course, a histogram, such as the histogram depicted in FIG. 15D, should be normalized in order for it to be properly referred to as a probability distribution function.

Another variation of the scheme depicted in FIGS. 15A-15D follows. Instead of stepping first and second points through a region of discrimination, the first and second discrimination points may be arranged at either end of the region of interest. For example, the first and second discrimination points may be initially set at 3.6 and 3.9 volts, per the example depicted in FIGS. 15A-15D. Then, the output of the discriminators may be delivered to a measurement circuit, such as circuit 300 (FIG. 3). Thus, whenever the data signal is between 3.6 and 3.9 volts at time $t=t_0$, a measurement is taken and stored. After a sufficient set of measurements have been generated, the measurements may be organized into "bins," as shown in FIG. 15D, and a probability density function may be constructed.

The remainder of the discussion relates to various manipulations of data acquired, whether acquired by the circuits of FIGS. 3 and 4 or not, and whether obtained using the timing/discrimination principles discussed with reference to FIGS. 5-15D or not. It is understood that the following methods may be implemented in hardware or software, and may be used in conjunction with the principles and inventions disclosed previously, or may be used alone.

Figure 16:
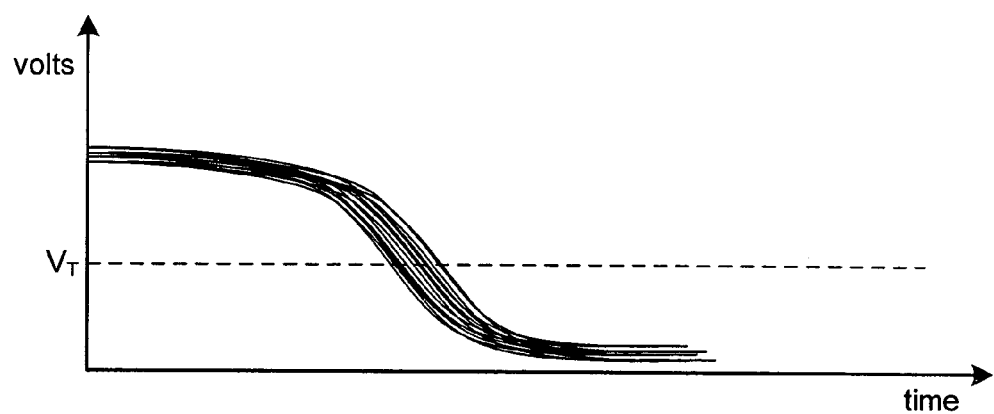
FIG. 16 depicts intersymbol interference exhibited by a data signal.

FIG. 16 depicts a set of transitions from a high voltage to a low voltage, in partial eye-diagram fashion. Ideally, each of these transitions should happen at the same point in time, as plotted on the chart of FIG. 16. However, in reality, each transition occurs at a slightly different time, as shown in FIG. 16. One major cause of this phenomenon is intersymbol interference (ISI). ISI is an effect that is caused by one or more symbols preceding the symbol exhibiting ISI.

Figure 17:
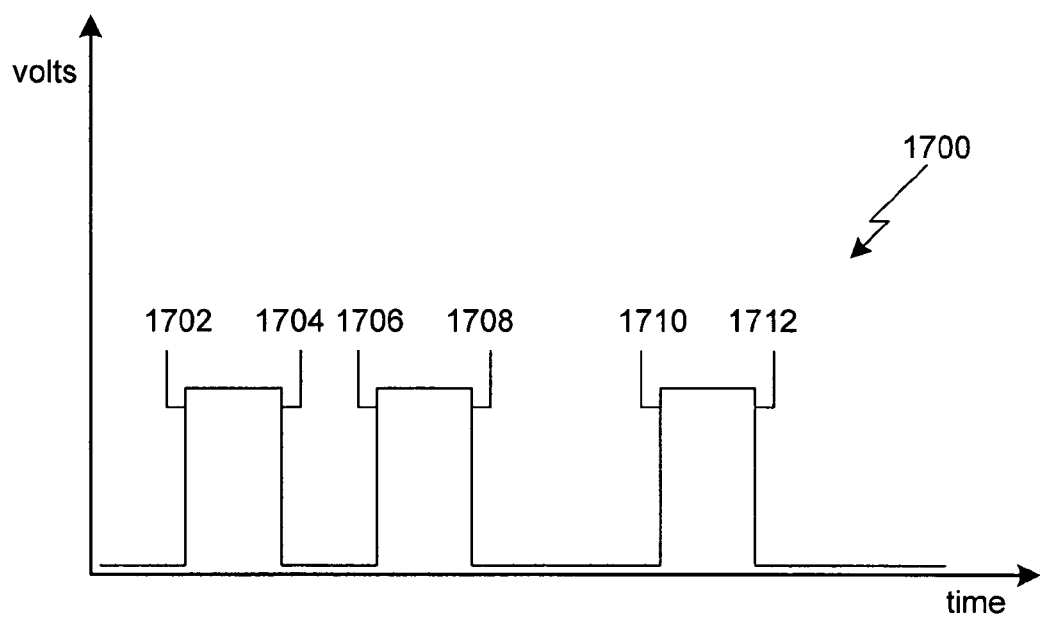
FIG. 17 depicts a signal illustrating transitions examined to determine intersymbol interference.

To measure the ISI exhibited by a system, one may make use of a test pattern. For example, FIG. 17 depicts a simplified exemplary test pattern 1700. As can be seen from FIG. 17, the test pattern 1700 includes six edges 1702-1712. To conduct an ISI measurement with test pattern 1700, the pattern 1700 is converted into a signal by a source. The signal is propagated through the system under test, and is received by a receiver. At the receiver, the time of each transition 1702-1712 (relative to the start of the received signal) is recorded. This procedure is repeated a multitude of times. Then, for each transition 1702-1712, the average time of transition, relative to the start of the received signal, is calculated. (Example: on average, transition 1702 occurred at time $t_1$, while transition 1704 occurred at time $t_2$, etc.). After such calculation, each average transition time is compared with a corresponding ideal transition time, and the most premature average transition time and tardiest average transition time are identified. (Example: on average, transition 1702 occurred at time $t_1$, but should have occurred at time $t_1'$; therefore, transition 1702 was, on average, early/tardy by a span of time equal to $t_1'-t_1$). ISI is expressed as the sum of: (1) the amount of time by which the most premature average transition time preceded its corresponding ideal transition time; and (2) the amount of time by which the tardiest average transition time lagged its corresponding ideal transition time.

In large part, ISI is created by non-ideal behavior of linear transmission media. This discussion pertains to so-called linear time-invariant (LTI) systems. From a basic point of view, the ISI experienced by a particular symbol is a summation of the constituent ISI contributions stemming from each of the symbols preceding the particular symbol. As will be discussed further, below, the individual contribution of a given symbol to the ISI experienced by a subsequent symbol can be determined by the step response of the medium. For present purposes, it is sufficient to note the following characteristics of ISI. First, although a particular symbol theoretically contributes ISI to every symbol that is transmitted subsequent to that particular symbol, in practice one can place a limit the number of subsequently transmitted symbols appreciably affected by the particular symbol. This limit is determined by the length of the step response of the medium. For example, if the step response of the medium is 3 unit intervals (UI's) in length, then it can be said that a particular symbol contributes to the ISI of only the three following symbols. Second, a particular symbol contributes to the ISI of a subsequent symbol by causing a vertical distortion therein. At any point in time, the vertical distortion can be calculated based upon the preceding transitions. Such a vertical distortion results in either a premature or tardy transition across the threshold voltage, $v_t$.

It should be noted that the "length" of a step response refers to the span of time (expressed usually in unit intervals) required for a step response to settle within a particular tolerance of a final value. The tolerance is generally chosen so as to be inconsequential, given the particulars of a given system.

ISI is an important figure in understanding the reliability of a communication system. However, heretofore there has not been a consistent way of defining this metric. Heretofore, it has been understood that ISI is caused by symbols preceding a particular symbol. Thus, to measure ISI, long test patterns (i.e., long sequences of 1's and 0's) are transmitted through a medium, and received and measured by a waveform analyzer. The ISI value arrived at depends upon the particular test pattern used. Thus, two engineers testing the same medium may arrive at different ISI values if they used different test patterns to conduct the test.

FIGS. 18-23 relate to schemes by which an "absolute" ISI (AISI) value may be determined. AISI is a value that represents the largest possible ISI value that could be exhibited by any test pattern. AISI provides a consistent and absolute metric for the design process.

Figure 18:
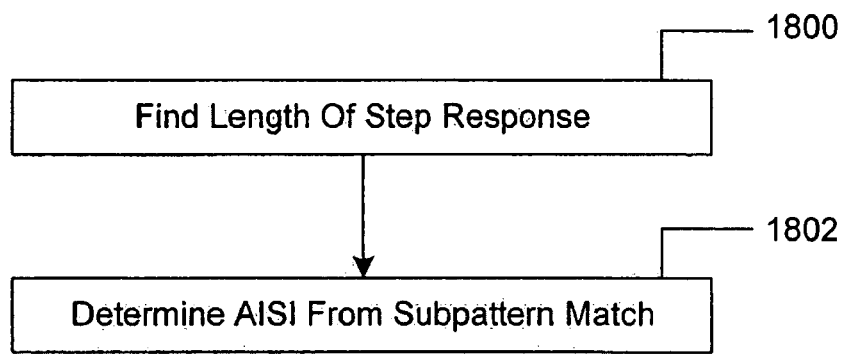
FIG. 18 depicts a scheme by which absolute intersymbol interference may be determined, according to one embodiment of the present invention.
Figure 19:
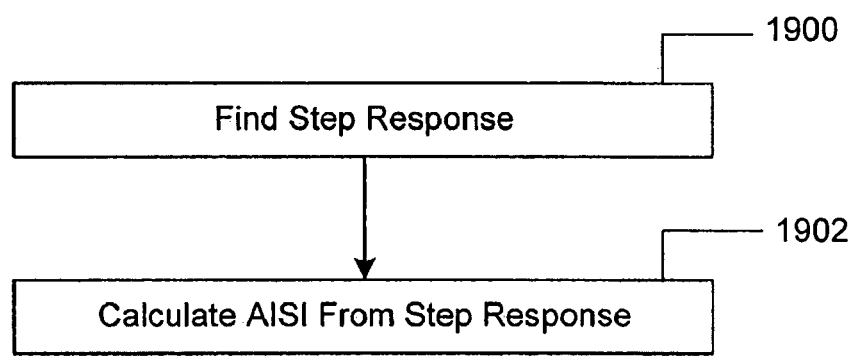
FIG. 19 depicts another scheme by which absolute intersymbol interference may be determined, according to one embodiment of the present invention.

As depicted in FIG. 18, AISI may be determined by finding the length of the step response of the medium (operation 1800), and by then performing an operation referred to as a "subpattern match," (operation 1802), which is discussed below. Alternatively, as depicted in FIG. 19, AISI may be determined by finding the step response, itself, (operation 1900), and by then calculating AISI from the step response (operation 1902). The processes involved in finding the step response of the medium, and of calculating AISI are discussed below.

Figure 20:
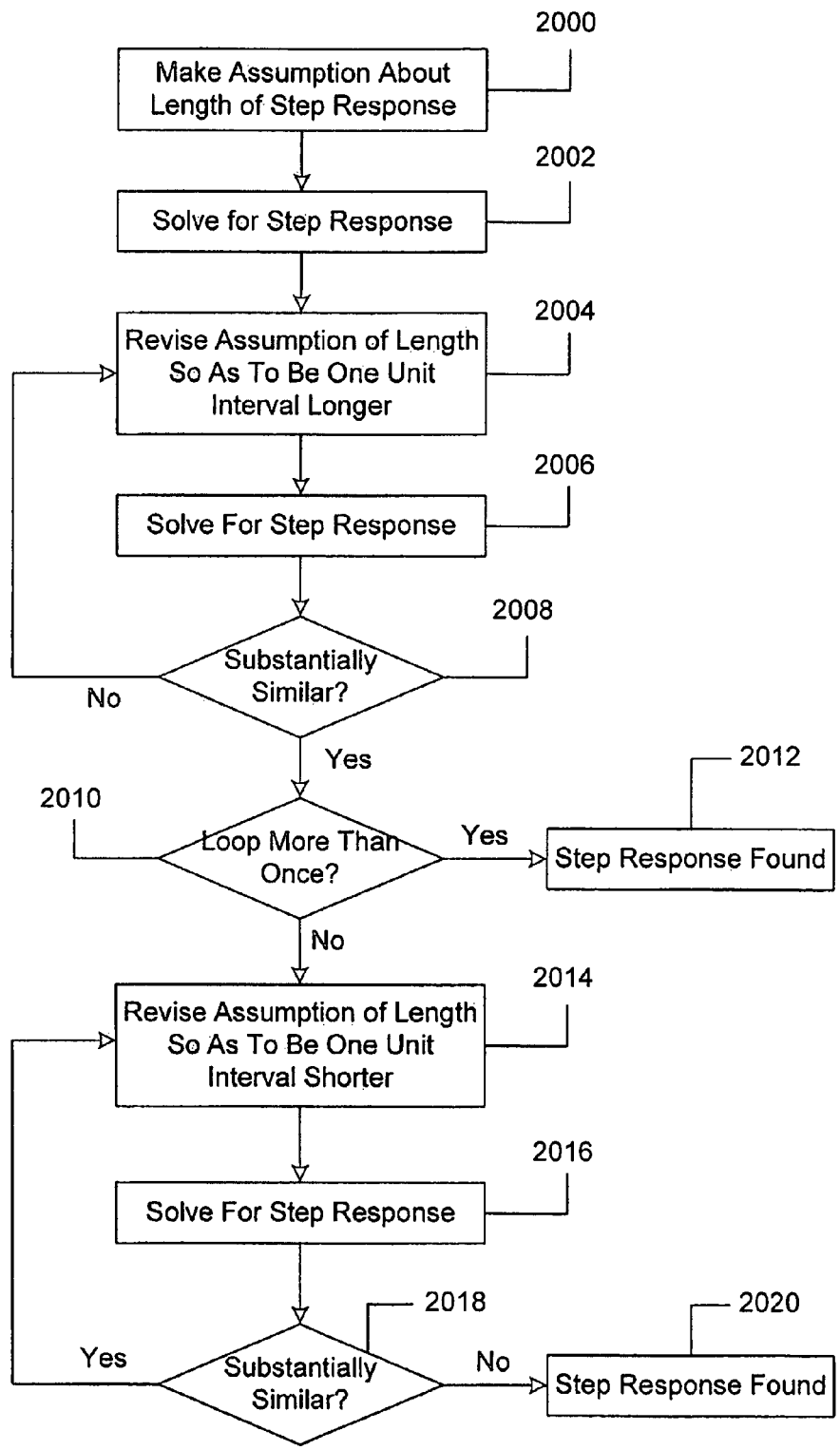
FIG. 20 depicts a scheme for finding a step response, according to one embodiment of the present invention.

FIG. 20 depicts a scheme for determining the length of the step response of the communication medium (measured in unit intervals). Initially, as shown in operation 2000, an assumption regarding the length of the step response is made. For example, it may be assumed that the step response of the medium is four unit intervals in length. Thereafter, in operation 2002, the step response is solved for, based upon the assumption made in operation 2000. The method for solving for the step response is described with reference to FIG. 21-23. Thereafter, as shown in operations 2004 and 2006, the assumption regarding the length of the step response is revised to be one unit interval longer than the original assumption made in operation 2000, and the step response is again solved for. For example, if it was initially assumed that the step response was four unit intervals in length, then in operation 2004 it is assumed that the step response is five unit intervals in length, and in operation 2006 the step response is solved for, using the assumption that the step response is five unit intervals in length.

In operation 2008, a decision is made regarding whether the step responses arrived at in operations 2002 and 2006 are substantially similar. If they are not substantially similar, the assumption made in operation 2000 is incorrect, and control is returned to operation 2004. Thus, an assumption is made that the step response is yet one more unit interval longer than the last assumption. Thus, for example, if the last time operation 2004 was traversed, it was assumed that the step response was five unit intervals in length, then it is presently assumed that the step response is six unit intervals in length. Once again, in operation, the step response is solved, using the assumption made in operation 2004. Once again, flow returns to query operation 2008, where a decision is made regarding whether the step responses arrived at the last two times operation 2006 was executed are substantially similar.

If they are substantially similar, flow moves on to operation 2010, where it is determined whether the loop defined by operations 2004, 2006, and 2008 was traversed more than once. If so, then the length of the step response is known. Specifically, the step response is one less than the last assumption posited in operation 2004. (Per the example presently being described, the length of the step response is known to be five unit intervals, because the last assumption posited in operation 2004 was six unit intervals).

On the other hand, if the loop was not traversed more than once, flow moves on to operation 2014, where the current assumption regarding the length of the step response is decremented by one unit interval. Thereafter, as shown in operation 2016, the step response is solved for using the assumption posited in operation 2014. In operation 2018, it is determined whether the step response solved for in operation 2016 is substantially similar to the last found step response. If so, control returns to operation 2014, whereupon the where the current assumption regarding the length of the step response is again decremented by one unit interval. Again, in operation 2016, the step response is solved for using the assumption most recently posited in operation 2014. Then, in operation 2418, it is determined whether the step response found in operation 2016 is substantially similar to the last found step response. If it is not substantially similar, then the length of the step response is known. Specifically, the step response is one greater than the last assumption posited in operation 2014.

It should be noted that operations 2014-2018 may be eliminated, if subsequent calculations using the step response are not time critical, or if they can be performed with adequate speed although the step response contains extraneous unit intervals.

Once the length of the step response of the medium is known, AISI may be found by performing a sub-pattern match, as alluded to in FIG. 18. A sub-pattern match process proceeds as illustrated by the following example. Using the length of the step response of the medium (determined via the process described with reference to FIG. 20), a set of bit sequences, or "sub-patterns," is determined. The set of bit sequences generates every possible advancement or delay value that can be exhibited by a transition. For example, assuming a step response length of three unit intervals, it is known that a particular bit experiences advancement or delay that is generated based upon the preceding two bits. Thus, if one looks for every two-bit permutation, and then measures the advancement or delay experienced by a transition following each one of the two-bit permutations, one will have seen every possible advancement or delay value. Of course, a transition following each two-bit permutation must be measured multiple times, and averaged, so as to remove other forms of jitter.

More specifically, per the above scenario, the set of bit sequences is:

{00,01,10,11}

After generating the aforementioned set, the waveform analyzer observes the incoming data signal, and awaits one of the bit sequences to occur. The waveform analyzer then measures the time at which the transition following the "matched" bit sequence crosses the voltage threshold, $V_T$ (FIG. 16). This process is repeated until each of the sub-patterns has been found to occur in the incoming data stream. When each of the sub-patterns has been "matched," the difference in time between the earliest transition and tardiest transition is found. This difference is the AISI.

If the length of the step response, expressed in unit intervals, is known, the technique of sub-pattern matching can be employed. For the sake of illustration, assume a settle time of n bits or unit intervals. Carrying on with this example, a waveform analyzer may measure an incoming symbol and correspond the measurement with the n bits previous to that measurement. The measurements can then be sorted according to the n-bit sub-pattern. Since all ISI can be accounted for by regarding the different sub-patterns, all of the remaining jitter can be attributed to other forms of jitter such as periodic jitter and or random jitter, etc. The use of sub-patterns as compared to whole patterns such as PRBS patterns allows measurements to be taken at a rate of more than just once per pattern. This is extremely useful when the pattern is very long and consequently repeats very infrequently.

The above-described sub-pattern match process may prove to be a lengthy process if the step response is lengthy, however. Thus, as described with reference to FIG. 19, the waveform analyzer may directly solve for AISI based upon knowledge of the step response.

Figure 21:
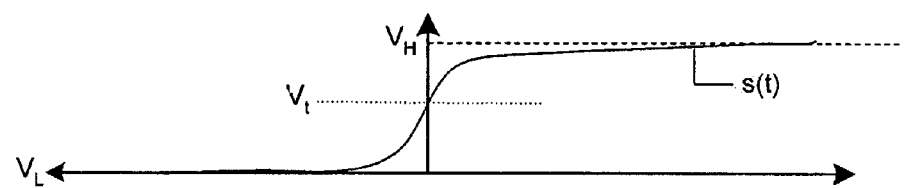
FIGS. 21-23 depict a scheme for finding a step response, according to one embodiment of the present invention.
Figure 22:
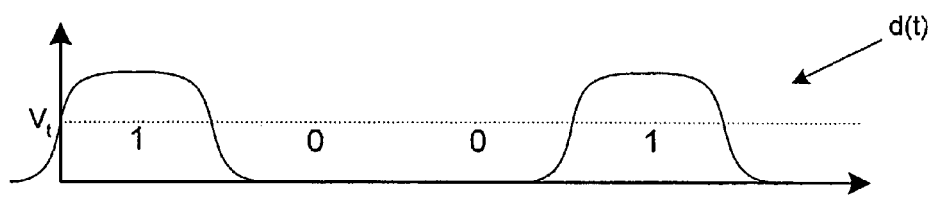
Figure 23:
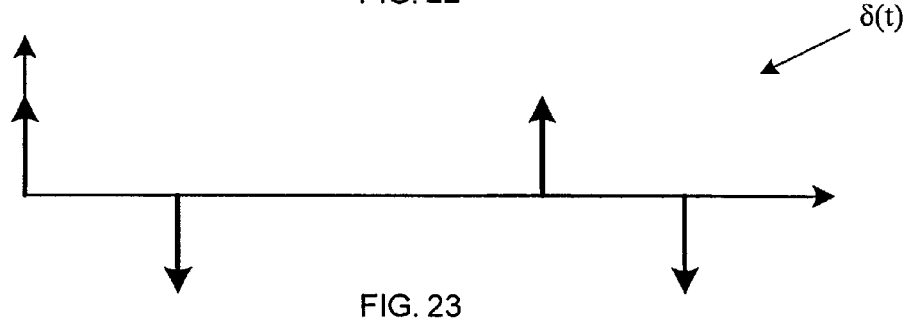

FIGS. 21-23 demonstrate one scheme for finding the step response of a medium. FIG. 21 depicts a step response, s(t), which is to be solved for. As can be seen from FIG. 21, the step response, s(t), is defined as crossing the threshold voltage, $V_t$, at time t=0.

FIG. 22 depicts a data signal, d(t). The data signal, d(t), is a signal that has been received by the waveform analyzer. Thus, the data signal, d(t), may be arrived at by simply decoupling a receiver from a transmission medium, and coupling the waveform analyzer to the medium in lieu of the receiver. Of course, a receiver need not be decoupled from the medium to permit coupling of the waveform analyzer; they may both be coupled to the medium. Thereafter, the waveform analyzer is permitted to receive the incoming data signal, and to sample it, thereby obtaining d(t). Alternatively, d(t) may represent any data signal, without regard to the technique of its acquisition. For example, d(t) may represent a data signal generated by a simulation software package.

FIG. 23 depicts a delta signal, δ(t), which may be calculated from the data signal, d(t), and stored within the waveform analyzer memory. The delta signal, δ(t), is composed of positive-going and negative-going impulse functions. A positive-going impulse function is synchronized with each positive-going threshold crossing exhibited by the data signal, d(t), and a negative-going delta function is synchronized with each negative-going threshold crossing exhibited by the data signal, d(t).

The data signal, d(t), is related to the step response, s(t), and the delta signal, δ(t), by the following relationship:

$$d(t)=\delta(t)\otimes s(t)$$

where the term "$\otimes$" refers to time-domain convolution.

Accordingly, s(t) is related to d(t) and δ(t) by the following relationship:

$$s(t)=d(t)\overline{\otimes}\delta(t)$$

where the term "$\overline{\otimes}$" refers to time-domain deconvolution.

Thus, to solve for the step response, s(t), the waveform analyzer may receive a data signal, d(t), construct a delta signal, δ(t), therefrom, and deconvolve the two.

Figure 24:
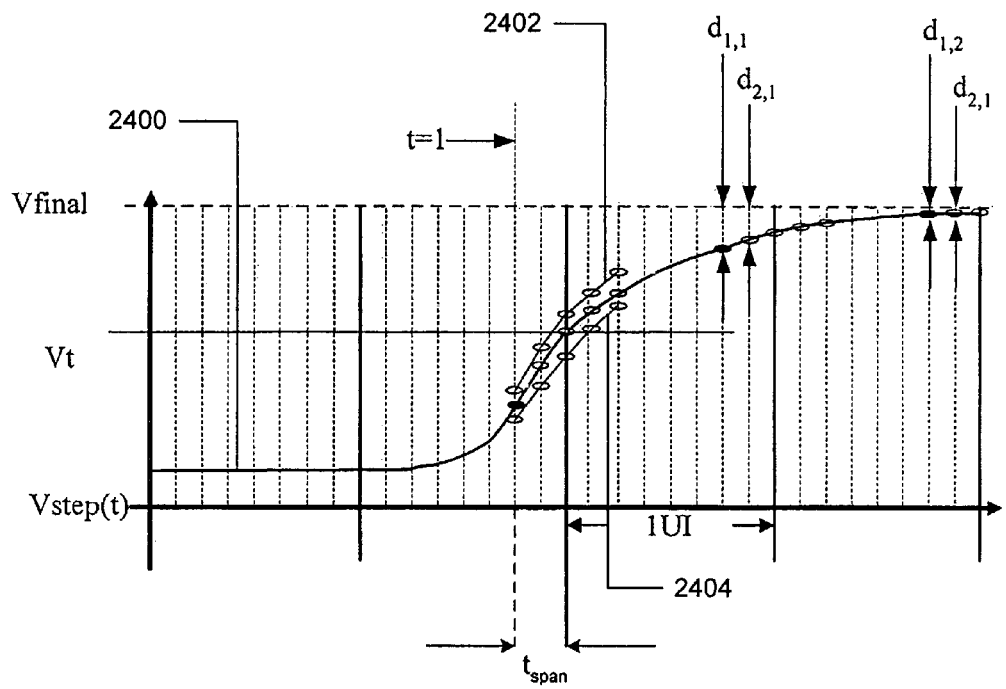
FIG. 24 depicts a scheme for finding absolute intersymbol interference based upon a step response, according to one embodiment of the present invention.

Once the step response has been arrived at, AISI may be found in one of two ways. FIG. 24 (below) reveals a technique for calculating AISI. On the other hand, AISI may be found in the following way.

Returning to the previous discussion, it is known that if the step response is n unit intervals in length, then the ISI exhibited by a particular bit is determined by only the n bits preceding the particular bit. One may create a set of all the possible n-bit data sequences that may precede a transition. For example, for a step response with a length of 3 unit intervals, the set may be: {000, 001, 010, 011, 100, 101, 110, 111}. Thereafter, each data sequence has a bit added to it, in order to create a transition following the three-bit sequence: {0001, 0010, 0101, 0110, 1001, 1010, 1101, 1110}.

Next, for each data sequence in the set, an impulse train as described in FIG. 23 is created for the data sequence. Thereafter, each impulse train is convolved with the step response to generate data patterns (recalling that $d(t)=\delta(t) \otimes s(t)$ that would result by virtue of transmitting the 4-bit pattern). AISI is then found by finding the difference, expressed in units of time, between the most advanced $v_t$ threshold crossing and the most retarded $v_t$ threshold crossing.

FIG. 24 depicts a step response 2400, such as that which may be arrived at via the scheme described with reference to FIG. 21-23. A step response 2400 shows the behavior of the system when "stepping" from a logic-level low voltage that has endured from time $t=-\infty$ to a logic-level high voltage enduring to time $t=\infty$.

During operation, the shape of a particular transition is influenced by the preceding steps in the data sequence, amongst other factors. As a practical matter, the length of the step response determines an upper limit upon the number of preceding steps that can possibly influence the shape of a particular step. For example, if the step response is three unit intervals in length, then only the steps occurring within the preceding three unit intervals can appreciably affect the shape of a given step.

The step response may be represented as a set of voltage-time pairs, so that it is represented as $v_{step}(t)$, where t is an integer. FIG. 24 depicts $v_{step}(t=1)$ and $v_{step}(t=2)$, and so on. Notably, $v_{step}(t=1)$ is flanked by to two other points, located at time t=1, and $v_{step}(t=2)$ is also flanked by two points located at time t=2. The aforementioned points represent the worst-case positive-going offset and worst-case negative going offset that can be exhibited by a transition, given a step response with a given shape and length. Thus, for a step response, $v_{step}(t)$, one may calculate for any value of t, a worst case positive-going offset and a worst-case negative-going offset.

To determine the worst-case positive going offsets and worst-case negative going offsets for a given value of t, the following steps are performed. First, for a given value of t, the span of time separating the particular point on the step response from a unit interval boundary is determined. For example, for $v_{step}(t=1)$, the span is shown as being $t_{span}$.

Next, a deficit sequence is generated. A deficit sequence is unique to a specific time value, meaning that a first deficit sequence corresponds to time t=1, while a second deficit sequence corresponds to time t=2. For a given time, t, a deficit sequence may be defined as a set:

defecit sequence$_{time=t}$={d$_{time=t,1}$, d$_{time=t,2}$, d$_{time=t,3}$, ... d$_{time=t,n}$} where n is one less than the length of the step response, as expressed in unit intervals, and where d$_{time=t,n}$ is equal to the difference between V$_{final}$ and the step response at point that is removed in time from the n$^{th}$ unit interval boundary by a span of time equal to t$_{span}$. Thus, for example, the defecit sequence for corresponding to time t=1 is:

{d$_{1,1}$, d$_{1,2}$} where d$_{1,1}$ represents the difference between V$_{final}$ and v$_{step}$ (t=1+1 U.I.), and d$_{1,2}$ represents the difference between V$_{final}$ and v$_{step}$ (t=1+2 U.I.).

Once a deficit sequence has been determined for a particular point in time, the maximum positive-going and negative-going offsets that can be exhibited at that time can be calculated. They are calculated thusly:

maximum positive-going offset at time, $t=d_{time=t,1}-\Sigma$(local minima within defecit sequence$_{time=t}$)+$\Sigma$(local maxima within defecit sequence$_{time=t}$)

maximum negative-going offset at time, $t=\Sigma$(local maxima within defecit sequence$_{time=t}$)-$\Sigma$(local minima within defecit sequence$_{time=t}$)

Accordingly, by calculating a worst-case positive-going and negative-going offset for each point in the step response 2400, an upper boundary 2402 and lower boundary 2404 for each point may be found. The difference in time between where the upper boundary and lower boundary cross the voltage threshold Vt is the AISI. Of course, interpolation may be used to determine where the upper and lower boundaries cross the voltage threshold Vt. Optionally, the worst-case positive-going and negative-going offset may be calculated for a restricted set of points along the step response 2400, as opposed to performing such a calculation for each point. Restricting the aforementioned calculation to a set of points has the benefit of decreasing processing time. Furthermore, it should be noted that the upper and lower boundaries 2402 and 2404 may be used to determine a boundary for an interior region of an eye diagram.

Figure 25:
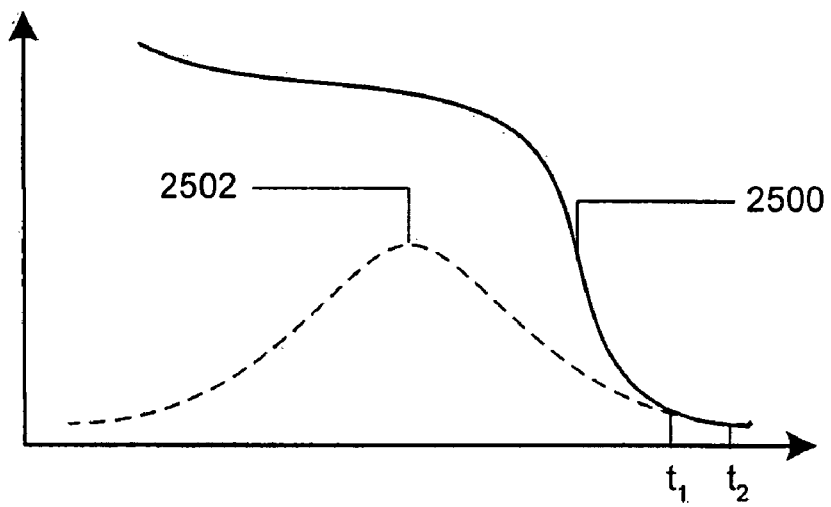
FIGS. 25 and 26 depict a scheme for determining the standard distribution of a normal distribution that fits the tail region of a distribution.
Figure 26:
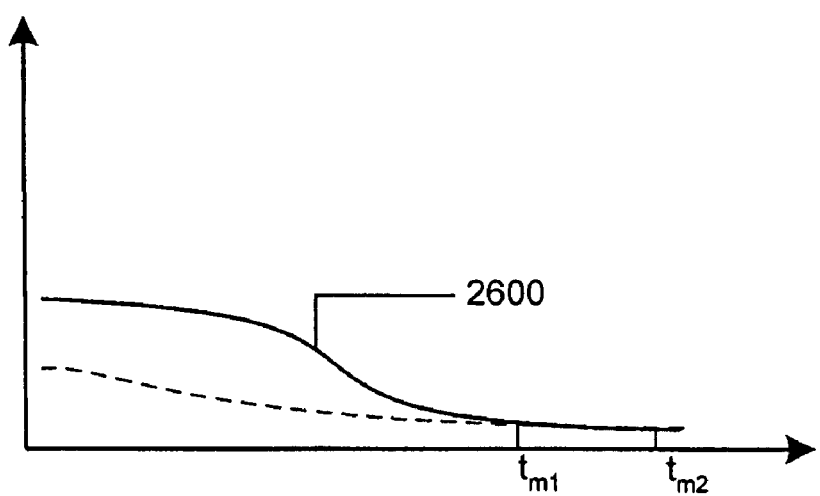

FIGS. 25 and 26 relate to a scheme by which a normal distribution may be fit to a tail region of a measured distribution. The benefits of performing this sort of procedure are described in U.S. Pat. No. 6,298,315 entitled "Method and Apparatus for Analyzing Measurements," issued Oct. 2, 2001 to Peng Li, which is incorporated herein by reference in its entirety.

FIG. 25 depicts a measured distribution 2500 of timing jitter. It is known that the tail region of such a distribution is due to forces that are random in nature, meaning that the tail region may be fit to a gaussian distribution 2502. In order to fit a tail region to a gaussian distribution, one must find the standard deviation, σ, of the gaussian distribution 2502.

To find the standard deviation, σ, one may use the following procedure. First, a waveform analyzer may directly measure a data signal to arrive at the distribution 2500. Thereafter, the waveform analyzer may select to points ($t_1$ and $t_2$) along the tail region of the distribution 2500. For each point $t_1$ and $t_2$, a probability value, $p_1$ and $p_2$, is determined. The probability values $p_1$ and $p_2$ represents the probability of the data signal exhibiting timing jitter greater than or equal to $t_1$ and $t_2$, respectively. (Of course, if the distribution represented amplitude noise, instead of timing jitter, the probability values $p_1$ and $p_2$ represents the probability of the data signal exhibiting amplitude noise greater than or equal to $v_1$ and $v_2$, respectively.)

Next, as shown in FIG. 26, a source of random noise is added to the incoming data signal 2500, and the data signal 2500 is once again measured by the waveform analyzer. The random source of noise must have a known standard deviation, which is denoted $\sigma_m$. This results in the distribution 2600 shown in FIG. 26. Thereafter, a point $t_{m1}$, which exhibits a probability of $p_1$ that the data signal 2600 will exhibit timing jitter greater than or equal to $t_{m1}$ is found. Similarly, a point $t_{m2}$, which exhibits a probability of $p_2$ that the data signal 2600 will exhibit timing jitter greater than or equal to $t_{m2}$ is found.

Finally, the waveform analyzer may perform the following calculation to find σ:

$$\sigma=\sigma_m/[[(t_{m2}-t_{m1})^2/(t_2-t_1)^2]-1]^{1/2}$$

Figure 27:
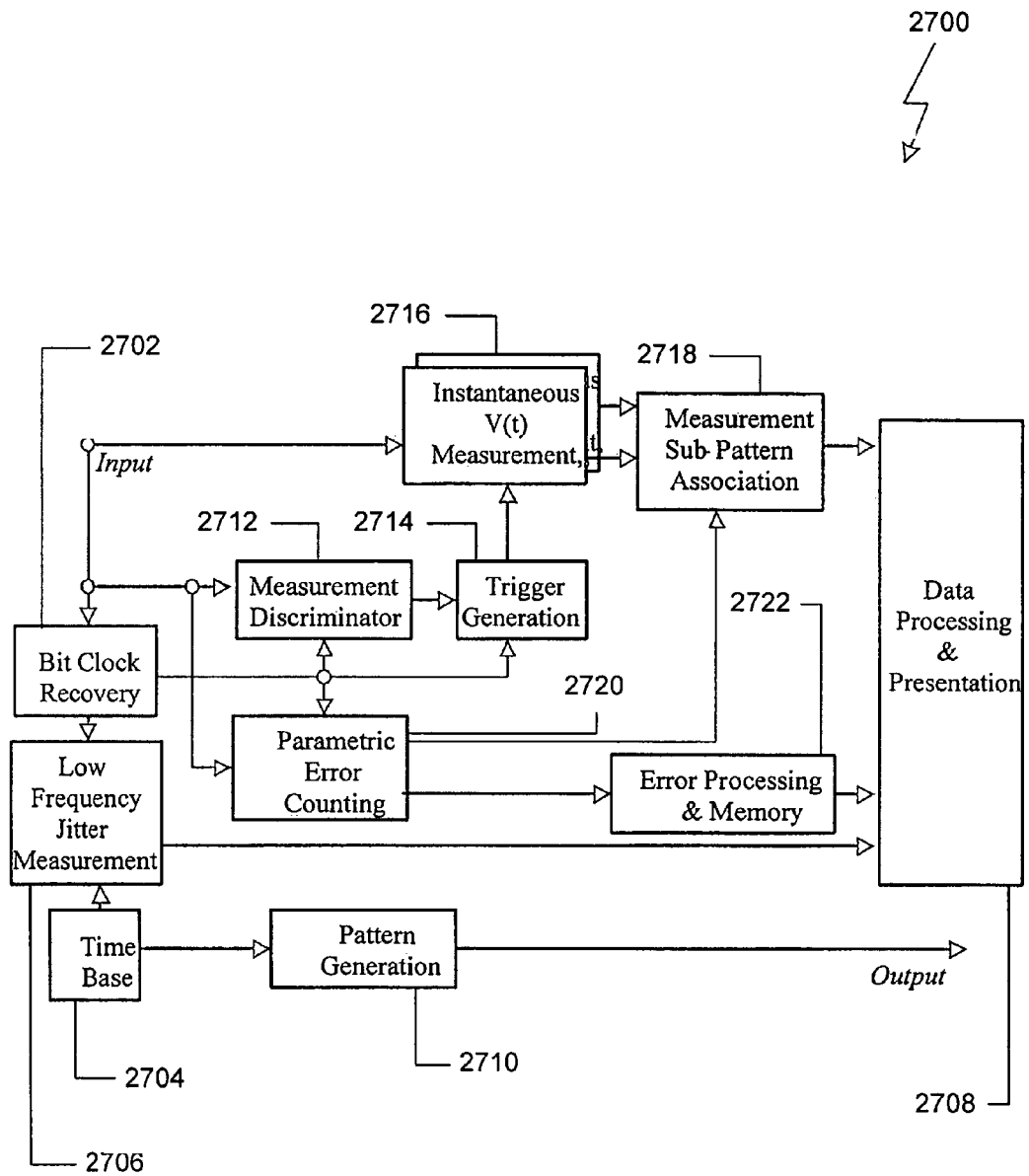
FIG. 27 depicts a waveform analyzer employing the various schemes and inventions disclosed herein, according to one embodiment of the present invention.

FIG. 27 depicts a waveform analyzer 2700 embodying at least one or all of the schemes, methods, circuits, and systems discussed herein with reference to FIGS. 1-26. As can be seen from FIG. 27, the waveform analyzer 2700 includes a clock recovery circuit 2702, which recovers a clock signal from an incoming data signal. The recovered clock signal is used as the timing base for the waveform analyzer, meaning that all timing signals within the system are a function of the clock signal recovered by the clock recovery circuit 2700. For example, all timing signals within the generator 2700 may be generated by delay elements using the recovered clock signal as inputs, and thereby delivering a delayed version of the recovered clock as an output.

A free-running clock 2704 is also included in the waveform generator. The free-running clock operates independently of the clock recovery circuit 2702. As can be seen from FIG. 27, the free-running clock 2704 delivers its output to a low-frequency jitter measurement circuit 2706, which also receives the recovered clock signal from the clock recovery circuit 2702 as an input. The low-frequency jitter measurement circuit 2706 generates an output that relates the recovered clock signal to the free-running clock, and delivers its output to a data processing system (e.g., microprocessor, memory, data input means, data output means, etc) 2708. The data processing system 2708 is programmed to relate the recovered clock signal to the free-running clock signal, so that absolute time information can be known about the incoming data signal. For example, if a first measurement is taken at a time $t_1$ relative to a first recovered clock edge, and a second measurement is taken at time $t_2$ relative to a second recovered clock edge, it is impossible to know the time separating the two measurements, unless a free-running clock (such as clock 2704) keeps track of time, and specifies the actual time of the unit intervals intervening between times $t_1$ and $t_2$. The output of the free-running clock 2704 is also delivered to a pattern generation unit 2710.

The output of the clock recovery circuit 2702 is delivered to a discriminator circuit(s) 2712, which determine whether or not to take a measurement, as discussed above herein. It should be noted that because the discriminator 2712 is provided with the recovered clock signal, it makes a decision regarding whether to take a measurement based upon the same information observed by a receiver in the communication system.

The output of the discriminator 2712 is coupled to a triggering system 2714, which combines the information relating to whether or not a measurement should be taken from a voltage-time discrimination point of view, and combines it with other arming functions (such as pattern recognition), so that a final decision regarding whether a measurement should be taken is provided to the measurement circuit(s) 2716.

The measurement circuit(s) 2716 may take on the form of the dynamic threshold measurement circuit described with reference to FIG. 3, or may take on another form. The output of the measurement circuit 2716 is a voltage-time pair that is provided to a sub-pattern matching unit 2718. The sub-pattern matching unit 2718 implements the sub-pattern matching function described herein, above. The function of the sub-pattern matching unit 2718 is to identify a sub-pattern within an incoming data stream, and if a sub-pattern is matched, it passes the measurements to the data processing system 2708. Otherwise, the measurement data may be discarded.

The discriminator unit 2712 also provides its output to a parametric error-counting unit 2720 that keeps count of the number of data symbols that satisfy the discrimination condition defined by the discriminator 2712. Finally, an error-processing unit 2722 stores and manipulates data with each incoming bit. The error-processing unit 2722 may be embodied as dedicated hardware, such as an application-specific integrated circuit. The error-processing unit 2722 performs manipulations and storage functions that occur too quickly for execution by a general-purpose microprocessor. For example, the error-processing unit 2722 may have a bit pattern stored therein, which is a replica of the bit pattern being transmitted to the waveform analyzer 2700. The error-processing unit makes a determination, with the reception of each bit, regarding whether a bit error has been observed. Based upon these determinations, a bit error rate may be calculated.

Intersymbol Interference Reversal

Figure 28:
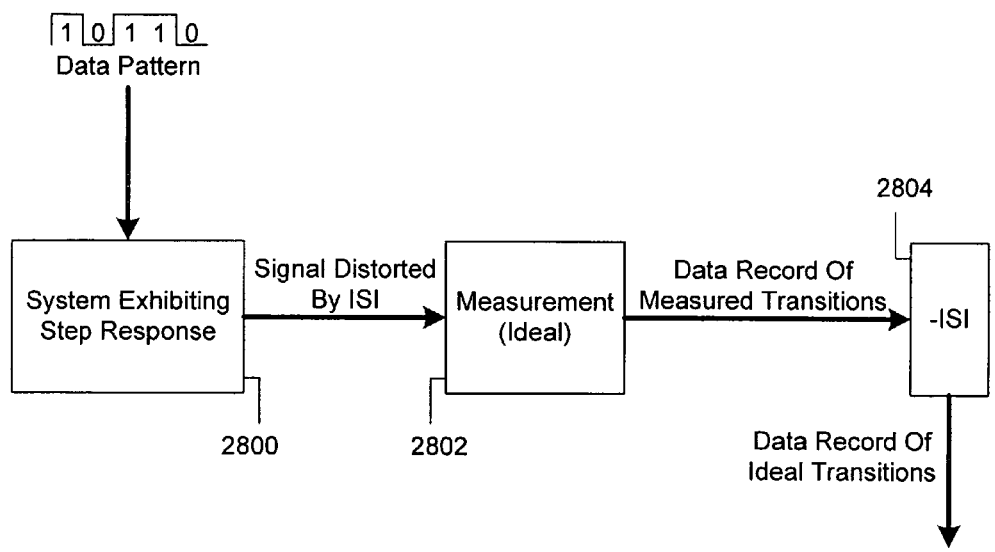
FIG. 28 depicts a scheme for reversal of intersymbol interference, according to one embodiment of the present invention.

FIG. 28 depicts a scheme for reversal of intersymbol interference (ISI), according to the principles previously described herein. The scheme of FIG. 28 includes a system 2800 that exhibits ISI. The system 2800 may receive a data signal that exhibits transitions at various points in time. In this case, the system 2800 introduces ISI to the data signal while propagating the data signal to a measurement device 2802. For present purposes, the measurement device 2802 is assumed to be ideal, meaning that any ISI introduced by the elements of the measurement device 2802 is included in the ISI system 2800, and is reversed by reversal element 2804. Therefore, the ISI exhibited by the ISI system 2800 includes all of the ISI introduced to the data signal from its reception by the ISI system 2800 to its measurement by device 2802. On the other hand, the ISI system 2800 may receive a data pattern that it converts to a data signal, and then propagates to device 2802. In this case, the ISI exhibited by the ISI system 2800 includes all of the ISI introduced to the data signal from its generation to its measurement by device 2802.

The measurement device 2802 receives the data signal that has been distorted by ISI, determines the points in time at which the signal exhibits transitions, and generates a data record reflecting this information. In other words, the data record indicates that at time $t_0$, the signal transitioned from a logic level "0" to a logic level "1," at time $t_1$, the signal transitioned back from a "1" to a "0," and so on.

The data record is received by a reversal system 2804 that, for each transition, determines the "time defect" (described below) introduced by the ISI of the system 2800, and subtracts out the time defect. For example, consider a transition occurring at time $t_0$ within a data signal, as the data signal is received at the ISI system 2800. Given the ISI introduced by the ISI system 2800, that same transition will be observed at time $t_0'$ by the measurement system 2802, and will be recorded in the data record as having occurred at time $t_0'$—not time $t_0$. The quantity $t_0'-t_0$ is the "time defect" introduced by the system 2800. When this time defect is subtracted from the corresponding entry in the data record, the original time of the transition is yielded (i.e., $t_0=t_0'-[t_0'-t_0]$). Thus, the effect of ISI is reversed, and a data record is generated by the reversal system 2804, reflecting the original times of transitions within the data signal, as exhibited by the data signal upon receival by the ISI system 2800 (or upon generation of the signal, if the ISI system 2800 generates the signal from a data pattern).

Figures 29, 30:
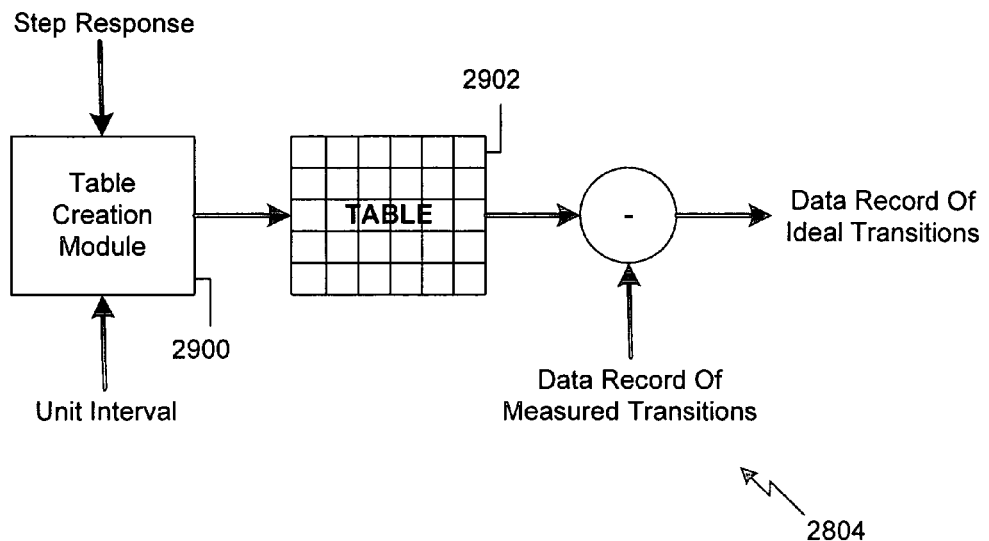
FIG. 29 depicts an embodiment of reversal system depicted in FIG. 28.
FIG. 30 depicts an exemplary embodiment of a table created by and/or used by a reversal system.

The reversal system 2804 is depicted in FIG. 29. The reversal system 2804 may be embodied in a general-purpose computing device, or in hardware, such as by an ASIC or combination of circuitry cooperating to execute the acts described below. The reversal system includes a table creation module 2900. The module 2900 receives as inputs: (1) the step response of the system 2800; and (2) the unit interval of the data signal within the data record from the measurement device 2802. In response, the process creates a table 2902, an example of which is depicted in FIG. 30.

The table 3000 of FIG. 30 is an exemplary table 2902 appropriate in the circumstances that the step response of the system 2800 is three unit intervals in length. The following discussion assumes that the system 2800 exhibits a step response having a length of three unit intervals. It is understood that, in principle, the system 2800 may exhibit a step response of any length, and that the particulars of the table 3000, and ensuing methods of generating the table 3000 vary based upon the length of the step response.

The table 3000 of FIG. 30 may be used to "look up" a time defect exhibited by a particular transition. As can be seen from FIG. 30, the table 3000 contains eight rows and five columns. In general, for a system 2800 exhibiting a step length of L unit intervals, the table 3000 has $2^L$ rows and L+2 columns (or vice versa if the table is transposed). The first L columns of each row of the table 3000 are populated so that they present, in total, each number between 0 and $2^L-1$. For example, the first L columns of the first row contain a binary representation of the number zero, the first L columns of the second row contain a binary representation of the number one, the first L columns of the third row contain a binary representation of the number two, and so on. For a given row, the $L+1^{th}$ column is populated so as to contain the opposite of the bit contained in the $L^{th}$ column. In other words, for a given row, if the $L^{th}$ column contains a "0," then the $L+1^{th}$ column contains a "1," and so on. Finally, for a given row, the $L+2^{th}$ column contains the time defect exhibited by a data pattern matching the bit sequence contained in the first L+1 columns of the particular row, given a particular step response of the system 2800. Thus, for example, the $L+2^{th}$ column of row 3002 stores the time defect exhibited by a transition from a "1" to a "0," given that a "1" and "0" preceded the final transition from a "1" to a "0," i.e., the total data pattern is "1010."

Returning to FIG. 29, after generation of the table 2902 (discussed below), the table may be used as follows. For a given transition recorded in a data record, the table 2902 may be used to obtain a time defect that may be subtracted from a time stamp corresponding to the given transition. Assuming a step response length of L, the time defect is obtained in the following manner. The preceding L−1 unit intervals are inspected to determine the data contained therein. It should be noted that, as a matter of convention herein, a unit interval is said to begin in at the midpoint of one bit and extend to the mid point of the next bit. Thus, each unit interval reveals two data bits. For example, the reader's attention is briefly turned to FIG. 33. Therein, three unit intervals are depicted (identified by the notation Q=1, Q=2, and Q=3). Turning to the unit interval identified by "Q=2," one can see that inspection of that particular span of time reveals that the signal exhibits a logic level of "0" at the beginning of the unit interval, and exhibits a logic level of "1" toward the end of the unit interval. For the sake of convention herein, a unit interval is said to contain the logic level exhibited by the signal at the beginning of the unit interval. Thus, the signal of FIG. 33 exhibits a "0" during unit interval Q=2. Returning to the discussion regarding use of the table 2902, as mentioned previously, for a given transition, the preceding L−1 unit intervals are inspected to determine the data contained therein. For example, consider a data pattern "1010," shown in FIG. 33. Assuming that the transition from "1" to "0" in unit interval Q=3 is to be corrected by subtraction of the time defect, then examination of unit intervals Q=1 and Q=2 ensues. Given the aforementioned convention, the data contained in unit interval Q=1 is a "1," while the data contained in unit intervals Q=2 is a "0." Next, the first L−1 columns of each row in the table 3000 are examined to determine which rows match the data in the L−1 unit intervals, i.e., "10". As can be seen from FIG. 30, only two rows match: row 3002 and the row immediately above it. To select between the two, the $L+1^{th}$ column of each of the two rows is examined. If the transition to be corrected is a transition from a "1" to a "0", then the row to be selected is the row with a "0" in the L+1th column (i.e., row 3002). Otherwise, the other row is selected. In this case, as described above, the transition to be corrected is a transition from a "1" to a "0," as shown in unit interval Q=3 of FIG. 33. Therefore, row 3002 is selected. Therefore, the time defect contained in the L+2th column of row 3002 is obtained from the table 3000, and is subtracted from the aforementioned timestamp contained in the aforementioned data record.

FIGS. 31-34 relate to a scheme for determining a time defect for a given row of a table 2902. The scheme may be repeated for each row of a given table, in order to populate the table 2902. For the sake of illustration FIGS. 31-34 are directed toward determining the time defect to be entered in the row identified by reference numeral 3002 in FIG. 30, but may be easily altered to determine the time defect for any row, as described below.

For a given system 2800, its step response may be described at a set of time-sequenced voltages: step response=$\{s_1, s_2, s_3, \ldots s_{LR}\}$, where L represents the length of the step response, expressed in unit intervals, and R represents the number of samples per unit interval. Thus, turning to FIG. 31, therein is depicted a step response exhibiting a length of 3 unit intervals. The step response is sampled 10 times per unit interval. Therefore, for the step response therein, step response=$\{s_1, s_2, s_3, \ldots s_{30}\}$.

Figure 31:
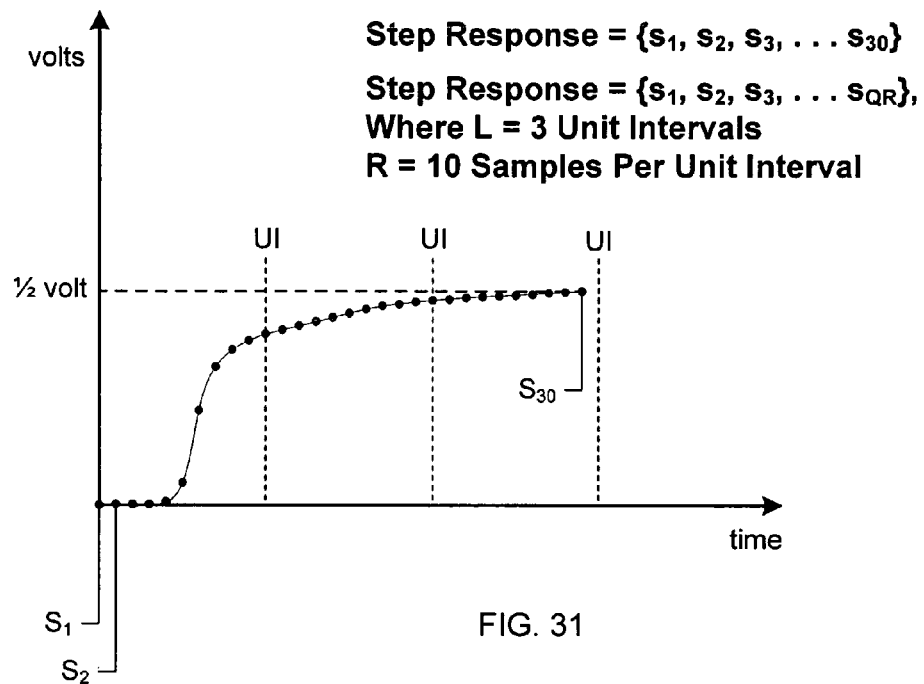
FIG. 31 depicts an exemplary step response.

Given a step response of length L, the time-sequenced voltages exhibited by a particular transition are a function of data in the preceding L−1 unit intervals, and are also a function of the step response of the system. Consider FIG. 33 in light of the example in which a given step response is 3 unit intervals in length (i.e., that which is shown in FIG. 31), and in which the time defect to be determined corresponds to the 1-0 transition exhibited in unit interval Q=3.

Figure 33:
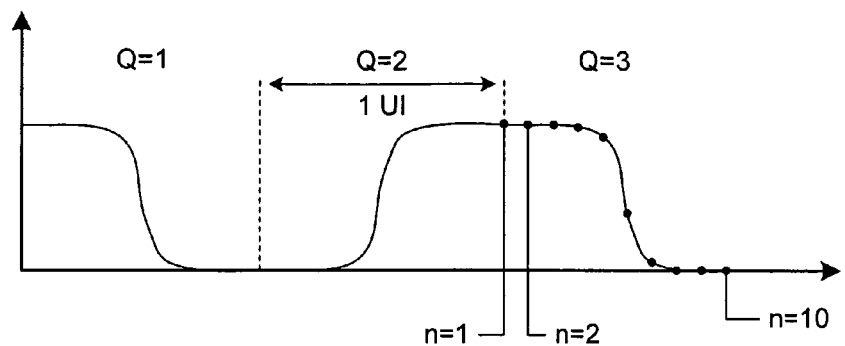
FIG. 33 depicts a waveform exhibiting three transitions.

As can be seen from FIG. 33, three unit intervals are depicted therein. The first unit interval is labeled Q=1, the second unit interval is labeled Q=2, and the final unit interval is labeled Q=3. The particular time-sequenced voltages exhibited by the transition shown in unit interval Q=3 are a function of the transitions occurring in unit intervals Q=1 and Q=2. More specifically, consider that the time-sequenced voltages in unit interval Q=3 may be denoted $y_{Q=3,n}$, where Q identifies the unit interval, and n denotes the sample number within a given unit interval. (In FIG. 33, the sample identified by "n=1" is $y_{Q=3,n=1}$ or $y_{3,1}$; the sample identified by "n=2" is $y_{Q=3,n=2}$ or $y_{3,2}$, and so on). For a given sample $y_{3,n}$ in unit interval Q=3, its value may be determined from the step response of the system and the data within unit intervals Q=1 and Q=2, as shown according to the scheme of FIG. 34.

Because the system 2800 exhibits a step response of a length of 3 unit intervals, the equation for $y_{Q=3,n}$ may be expressed as the sum of the terms:

$$y_{Q=3,n} = C +/- [0,1]s_{2R+n} +/- [0,1]s_{R+n} +/- s_n,$$

where C is a constant equal to 0 or to a voltage level corresponding to a logical "1," as explained below. As a matter of general applicability, the number of terms in the aforementioned summation is equal to the length of the step response in unit intervals.

Figure 34:
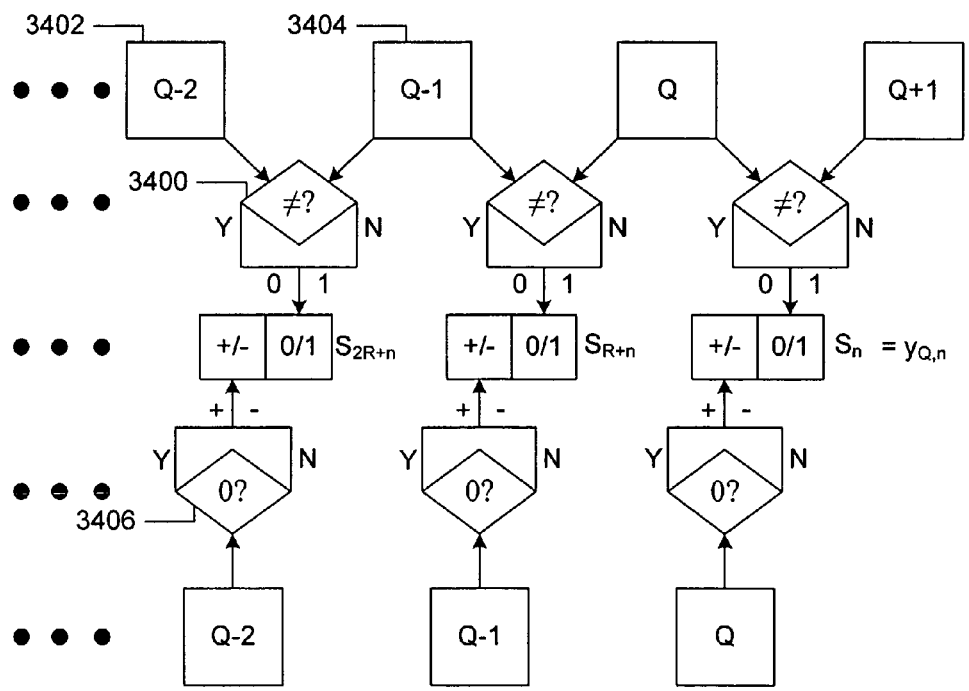
FIG. 34 depicts a scheme by which time-sequenced voltages exhibited by a transition can be determined from a step response.

As shown in FIG. 34, each term in the summation may be multiplied by a factor of +1, −1, or 0. With regard to the first factor in the summation, i.e., $s_{2R+n}$, the following process is used to determine whether the factor multiplied therewith is zero or non-zero. A factor decision unit 3400 is provided with two units of input data: (1) the bit value 3402 of the signal during unit interval Q=1, which is a "1," given the aforementioned convention; and (2) the bit value 3404 of the signal during unit interval Q=2. If the two bit values are unequal, then the factor is determined to be +/−1, otherwise the factor is zero. In the case of the signal depicted in FIG. 33, the values are not equal, so the factor is +/−1.

To determine whether the factor is positive or negative, a decision unit 3406 receives a single unit of input data: the bit value 3402 during unit interval Q=1, i.e., a "1". If the bit value is a "0", then the factor is positive, otherwise the factor is negative. In this case, the bit value is a "1", so the factor is negative. Hence, the first factor in the summation is: $-s_{2R+n}$.

As can be seen from FIG. 34, each of the other terms is similarly determined, resulting in the following three terms: $-s_{2R+n} + s_{R+n} - s_n$. Although not depicted in FIG. 34, the scheme for determining a formula for time-sequenced voltages exhibited by the transition shown in unit interval Q=3 (or any other unit interval, for that matter), involves one final step: determining the value of the aforementioned constant, C. This determination is made thusly: if the first term in the summation is positive, C=0, otherwise C is equal to a voltage corresponding to a logic level "1". In this case, since the first term in the summation is negative, C=½, assuming that ½ volt corresponds to a logic level "1". Thus, for the signal shown in FIG. 33, $$y_{Q=3,n} = \tfrac{1}{2} - s_{2R+n} + s_{R+n} - s_n.$$

Figure 32:
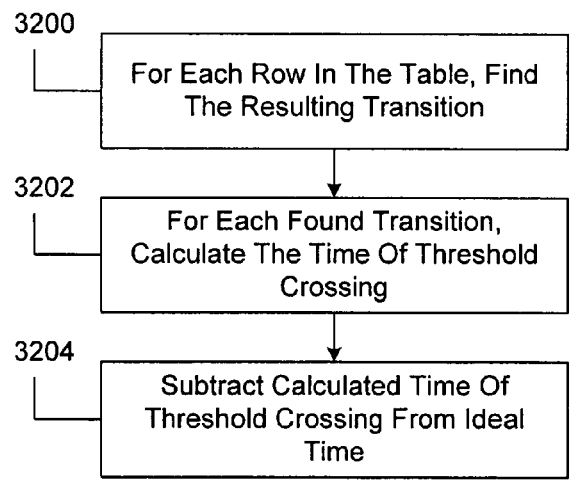
FIG. 32 depicts a method for populating certain entries of the table described in FIG. 29.

Turning to FIG. 32, the table 2902 may be populated thusly. Initially, for each row in the table 2902, the equation for the time-sequenced voltages exhibited by the transition described by $L^{th}$ and $L+1^{th}$ columns of a given row are found according to the just-described method, as shown in operation 3200. Next, as shown in operation 3202, for each row, the equations determined during operation 3200, are used in order to determine the time of threshold crossing (voltages samples most closely straddling the threshold may be found, and a threshold crossing time may be determined by interpolation). Finally, for each row, the threshold crossing time determined in step 3202 is subtracted from the corresponding "ideal" threshold crossing time to determine the time defect for population of the $L+2^{th}$ column of a given row.

It should be noted that the possibility exists that a particular system 2800 exhibits a positive-going step response that differs from its negative-going step response. Per such a scenario, the aforementioned equation for the time-sequenced voltages within a particular transition must be modified to utilize one step function for preceding positive-going transitions and another step function for preceding negative-going transitions. For example, assume that the ISI system 2800 exhibits a step response $S'_n$ for a positive-going step, and exhibits a step response $S''_n$ for a negative-going step. Given such a scenario, the equation is modified as follows:

$$y_{Q=3,n} = \tfrac{1}{2} - [\tfrac{1}{2} - S''_{2R+n}] + S'_{R+n} - [\tfrac{1}{2} - S''_n],$$

again assuming that ½ volt corresponds to a logic level "1." Thus, in a general case, an equation developed assuming symmetric step responses is modified to substitute a term of [logic level "1"−negative-going step response] for the negative step response term(s) otherwise found in the equation, according to the scheme of FIG. 34.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

Furthermore, in the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus, the following claims are hereby incorporated into the detailed description, with each claim standing on its own as a separate preferred embodiment.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

The claimed invention is:

1. A method of removing the effect of intersymbol interference (ISI) from a data record indicating times of logic level transitions exhibited by a data signal that has been distorted by ISI exhibited by a system having a particular step response, the method comprising:
   determining the step response and a step response length of the system exhibiting ISI;
   determining a set of time defect values based on two or more possible input transition patterns and based at least in part on the step response and the step response length;
   receiving the data record with a receiver of the system;
   selecting a transition from within the data record for removal of ISI;
   inspecting preceding transitions within the data record;
   obtaining a current time defect, based at least in part upon the inspected preceding transitions and based at least in part on the set of time defect values; and
   adjusting the data record, based upon the current time defect, to indicate a new time of transition for the selected transition, thereby removing the effect of ISI for the selected transition.

2. The method of claim 1, further comprising creating a table of time defects for a set of transition patterns of the two or more possible input transition patterns from which the current time defect may be obtained.

3. The method of claim 2, wherein the table is created, based at least in part upon the length of the step response of the system exhibiting ISI.

4. The method of claim 3, wherein the table is created, based at least in part upon a unit interval of the data signal.

5. The method of claim 4, wherein the unit interval of the data signal is determined from the transitions recorded in the data record.

6. The method of claim 1, wherein the act of obtaining the current time defect comprises a table to obtain the current time defect.

7. The method of claim 1, wherein the act of adjusting the data record comprises subtracting the current time defect from the time of transition corresponding to the selected transition within the data record.

8. The method of claim 1, further comprising:
receiving a signal;
distorting the signal with ISI;
and delivering the signal to a measurement device that measures the distorted data signal to generate said data record.

9. The method of claim 1, wherein a plurality of transitions within the data record are selected for removal of ISI.

10. The method of claim 9, wherein each transition within the data record is selected for removal of ISI.

11. The method of claim 1, wherein the time defect is determined by determining when the selected transition would have occurred given a step response of the system, and determining when the selected transition ideally should have happened given a unit interval of the data signal.

12. The method of claim 10, wherein the time defect is determined by subtracting the time at which the selected transition ideally should have happened from the time at which selected transition would have occurred given a step response of the system.

13. The method of claim 1, wherein determining the step response further comprises determining the step response by deconvolution of the data record and a delta signal, wherein the delta signal is composed of one or more positive going and negative going impulse functions based on the data record.

14. The method of claim 1, wherein determining the step response length further comprises:
assuming a step response length;
calculating a first step response for the assumed step response length and data record;
incrementing the assumed step response length by one unit interval;
calculating a second step response for the incremented step response length and data record; and
comparing the first and second step responses.

15. The method of claim 1, wherein determining the step response length further comprises:
assuming a step response length;
calculating a first step response for the assumed step response length and data record;
decrementing the assumed step response length by one unit interval;
calculating a second step response for the decremented step response length and data record; and
comparing the first and second step responses.

16. The method of claim 1, wherein determining the set of time defect values further comprises determining a set of time defects by calculating each time defect of the set of time defect values from a possible input data record convoluted with the determined step response.

17. The method of claim 1, wherein determining the time defects of the set of time defects utilizing a subpattern match, wherein the subpattern match comprises:
determining all possible data patterns that can occur in the length of the step response; and
matching each possible data pattern when it occurs in the data record and obtaining a time defect for the data pattern.

18. A method of measuring the effect of intersymbol interference (ISI) in a data record indicating times of logic level transitions exhibited by a data signal that has been distorted by ISI exhibited by a system having a particular step response, the method comprising:
determining the step response of the system exhibiting ISI and determining a step response length;
determining a set of time defects based on two or more possible input data transition patterns and based at least in part on the step response and the step response length;
receiving the data record with a receiver of the system;
selecting a transition from within the data record for measurement of ISI;
inspecting preceding transitions within the data record; and
obtaining a selected time defect, based at least in part upon the inspected preceding transitions and based at least in part on the set of time defects for the effect of ISI for the selected transition.

19. The method of claim 18, wherein determining the step response further comprises determining the step response by deconvolution of the data record and a delta signal, wherein the delta signal is composed of one or more positive going and negative going impulse functions based on the data signal.

20. A system for removal of the effect of intersymbol interference (ISI) from a data record, comprising:
a receiver adapted to receive a data signal having indicating times of logic level transitions for a data record that has been distorted by ISI, wherein the system has a particular step response; and
wherein the receiver is further adapted to:
determine the step response of the system and a step response length;
determine a set of time defects based on two or more possible input data transition patterns and based at least in part on the step response and the step response length;
select a transition from within the data record of the data signal for removal of ISI;
inspect preceding transitions within the data record;
select a time defect, based at least in part upon the inspected preceding transitions and based at least in part on the set of time defects; and
adjust the data record, based upon the selected time defect, to indicate a new time of transition for the selected transition, thereby removing the effect of ISI for the selected transition.

* * * * *